United States Patent
Glunz et al.

(10) Patent No.: US 9,817,922 B2
(45) Date of Patent: Nov. 14, 2017

(54) METHOD AND SYSTEM FOR CREATING 3D MODELS FROM 2D DATA FOR BUILDING INFORMATION MODELING (BIM)

(71) Applicants: Benjamin F. Glunz, Elgin, IL (US); Wayne R. Pearson, McHenry, IL (US); Alfredo F. Munoz, Hanover Park, IL (US)

(72) Inventors: Benjamin F. Glunz, Elgin, IL (US); Wayne R. Pearson, McHenry, IL (US); Alfredo F. Munoz, Hanover Park, IL (US)

(73) Assignee: Anguleris Technologies, LLC, Elign, IL (US)

( * ) Notice: Subject to any disclaimer, the term of this patent is extended or adjusted under 35 U.S.C. 154(b) by 720 days.

(21) Appl. No.: 14/194,717

(22) Filed: Mar. 1, 2014

(65) Prior Publication Data
US 2015/0248503 A1   Sep. 3, 2015

(51) Int. Cl.
*G06G 7/48* (2006.01)
*G06F 17/50* (2006.01)
*G06T 17/00* (2006.01)

(52) U.S. Cl.
CPC .............. *G06F 17/50* (2013.01); *G06T 17/00* (2013.01)

(58) Field of Classification Search
CPC ....... H04L 67/02; H04L 63/00; H04L 67/102; G06T 17/00; G06F 9/4443; G06F 9/5027; G06F 9/5072; G06F 17/50; A61C 8/0048; A61C 8/0012; A61C 8/8048; G02B 20/017; G02B 20/17; G06Q 10/06; G06Q 10/063; G06Q 30/018; G06Q 10/067; G06K 7/10366
See application file for complete search history.

(56) References Cited

U.S. PATENT DOCUMENTS

| | | |
|---|---|---|
| 7,295,955 B2 | 11/2007 | Sit |
| 7,949,690 B2 | 5/2011 | McArdle et al. |
| 8,427,473 B2 | 4/2013 | Elsberg et al. |
| 8,463,765 B2 | 6/2013 | Lesavich |

(Continued)

FOREIGN PATENT DOCUMENTS

| | | |
|---|---|---|
| WO | WO2011051639 | 5/2011 |
| WO | WO2014/111587 A2 | 7/2014 |

(Continued)

OTHER PUBLICATIONS

PCT/US2015/047,229—Partial PCT International Search Report (1 page) Anguerlis Technologies, LLC—Glunz, et al.

*Primary Examiner* — Kandasamy Thangavelu
(74) *Attorney, Agent, or Firm* — Lesavich High-Tech Law Group, S.C.; Stephen Lesavich

(57) ABSTRACT

A method and system for creating three dimensional (3D) models from two dimensional (2D) data for building information modeling (BIM). The method and system allow new, 2D, 3D and higher dimensional models to be created for existing 3D modeling programs (e.g., AUTODESK REVIT, AUTOCAD, VECTORWORKS, MICROSTATION, ARCHICAD, etc.). The new models are used to enhance and extend existing 3D modeling programs. The new models can also be used to directly create physical objects (e.g., windows, doors, etc.) represented by the new models with robots, 3D printers and manufacturing machines.

20 Claims, 13 Drawing Sheets

(56) References Cited

U.S. PATENT DOCUMENTS

| | | |
|---|---|---|
| 8,484,231 B2 | 7/2013 | Li et al. |
| 8,558,658 B2 | 10/2013 | Kumar et al. |
| 8,606,554 B2 | 12/2013 | Zimmermann et al. |
| 8,793,790 B2 | 7/2014 | Khurana et al. |
| 9,037,564 B2 | 5/2015 | Lesavich et al. |
| 9,137,250 B2 | 9/2015 | Lesavich et al. |
| 9,361,479 B2 | 6/2016 | Lesavich et al. |
| 9,569,771 B2 | 2/2017 | Lesavich et al. |
| 9,667,948 B2 | 5/2017 | Wang et al. |
| 2003/0117405 A1* | 6/2003 | Hubrecht ............... G06T 17/00 345/543 |
| 2005/0081161 A1 | 4/2005 | Macinnes |
| 2006/0044307 A1* | 3/2006 | Song ..................... G06Q 10/06 345/419 |
| 2006/0136179 A1 | 6/2006 | Sit |
| 2007/0239409 A1* | 10/2007 | Alan ................... G06F 17/5009 703/2 |
| 2008/0015947 A1* | 1/2008 | Swift ..................... G06Q 30/00 705/26.1 |
| 2008/0059220 A1 | 3/2008 | Roth et al. |
| 2008/0249756 A1 | 10/2008 | Chaisuparasmikul |
| 2008/0281573 A1 | 11/2008 | Seletsky et al. |
| 2009/0125283 A1* | 5/2009 | Conover ................ G06Q 10/10 703/1 |
| 2009/0288012 A1 | 11/2009 | Hertel |
| 2009/0292509 A1 | 11/2009 | Thompson et al. |
| 2010/0070241 A1 | 3/2010 | Opdahl et al. |
| 2010/0110071 A1 | 5/2010 | Elsberg et al. |
| 2010/0223032 A1 | 9/2010 | Reghetti |
| 2010/0280836 A1 | 11/2010 | Lu et al. |
| 2011/0008754 A1* | 1/2011 | Bassett ................. A61C 8/0012 433/175 |
| 2011/0050687 A1* | 3/2011 | Alyshev ............... G06F 9/4443 345/419 |
| 2011/0054652 A1 | 3/2011 | Heil |
| 2011/0071805 A1 | 3/2011 | Pendyala et al. |
| 2011/0087350 A1* | 4/2011 | Fogel ..................... G06F 17/50 700/98 |
| 2011/0093424 A1 | 4/2011 | Zimmermann et al. |
| 2011/0133884 A1 | 6/2011 | Kumar et al. |
| 2011/0166824 A1 | 7/2011 | Haisty |
| 2011/0169826 A1* | 7/2011 | Elsberg ................. G06T 15/005 345/419 |
| 2011/0178831 A1* | 7/2011 | Ravichandran ........ G06Q 10/06 705/7.11 |
| 2011/0208710 A1 | 8/2011 | Lesavich et al. |
| 2011/0218777 A1 | 9/2011 | Chen et al. |
| 2011/0246329 A1 | 10/2011 | Geisner |
| 2011/0285851 A1 | 11/2011 | Plocher et al. |
| 2011/0307281 A1* | 12/2011 | Creveling ............ G06Q 10/063 705/7.11 |
| 2012/0069131 A1* | 3/2012 | Abelow ................ G06Q 10/067 348/14.01 |
| 2012/0105581 A1 | 5/2012 | Berestov |
| 2012/0154389 A1* | 6/2012 | Bohan ................... G06F 9/5072 345/419 |
| 2012/0167122 A1* | 6/2012 | Koskimies ............ G06F 9/5027 719/328 |
| 2012/0169710 A1 | 7/2012 | Senescu |
| 2012/0203806 A1 | 8/2012 | Panushev |
| 2012/0215500 A1 | 8/2012 | Ciuti et al. |
| 2012/0265707 A1 | 10/2012 | Bushnell |
| 2012/0278622 A1 | 11/2012 | Lesavich et al. |
| 2012/0284596 A1 | 11/2012 | Bushnell et al. |
| 2012/0296609 A1 | 11/2012 | Khan et al. |
| 2012/0296610 A1 | 11/2012 | Hailemariam et al. |
| 2012/0310906 A1 | 12/2012 | Miller et al. |
| 2013/0013265 A1 | 1/2013 | Narayan et al. |
| 2013/0082101 A1 | 4/2013 | Omansky et al. |
| 2013/0091539 A1 | 4/2013 | Khurana et al. |
| 2013/0095864 A1* | 4/2013 | Marovets ................ H04W 4/14 455/466 |
| 2013/0125029 A1 | 5/2013 | Trimbl |
| 2013/0132466 A1* | 5/2013 | Miller ..................... H04L 67/02 709/203 |
| 2013/0144566 A1 | 6/2013 | De Biswas |
| 2013/0144746 A1 | 6/2013 | Phung |
| 2013/0155058 A1 | 6/2013 | Golparvar-Fard |
| 2013/0179207 A1 | 7/2013 | Perez Rodriguez |
| 2013/0182103 A1 | 7/2013 | Lee et al. |
| 2013/0185024 A1 | 7/2013 | Mahasenan et al. |
| 2013/0235029 A1 | 9/2013 | Keough et al. |
| 2013/0238125 A1 | 9/2013 | Suzuki |
| 2013/0257850 A1 | 10/2013 | Chen et al. |
| 2013/0268357 A1* | 10/2013 | Heath .................... H04L 63/00 705/14.53 |
| 2013/0271488 A1* | 10/2013 | Stirbu ..................... G09G 5/14 345/619 |
| 2013/0278631 A1* | 10/2013 | Border ................ G02B 27/017 345/633 |
| 2013/0303193 A1 | 11/2013 | Dharwada et al. |
| 2013/0307682 A1 | 11/2013 | Jerhotova et al. |
| 2013/0314210 A1 | 11/2013 | Schoner et al. |
| 2013/0314232 A1 | 11/2013 | Jerhotova et al. |
| 2013/0315437 A1* | 11/2013 | Kerschner ............ G06Q 30/018 382/100 |
| 2013/0328872 A1* | 12/2013 | Suomi .................... G06T 17/20 345/420 |
| 2013/0335413 A1 | 12/2013 | Wang et al. |
| 2014/0013262 A1 | 1/2014 | Milostic |
| 2014/0035726 A1* | 2/2014 | Schoner ............. G06K 7/10366 340/8.1 |
| 2014/0039845 A1 | 2/2014 | Saban et al. |
| 2014/0051037 A1* | 2/2014 | Fisker ................... A61C 8/0048 433/213 |
| 2014/0089209 A1 | 3/2014 | Akcamete et al. |
| 2014/0189792 A1 | 7/2014 | Lesavich et al. |
| 2014/0192159 A1 | 7/2014 | Chen et al. |
| 2014/0195420 A1 | 7/2014 | Trickel |
| 2014/0207774 A1 | 7/2014 | Walter et al. |
| 2014/0210856 A1 | 7/2014 | Finn |
| 2014/0214215 A1 | 7/2014 | Han et al. |
| 2015/0116465 A1 | 4/2015 | Wang et al. |
| 2015/0248503 A1 | 9/2015 | Glunz et al. |
| 2015/0248504 A1 | 9/2015 | Glunz et al. |
| 2015/0379301 A1 | 12/2015 | Lesavich et al. |
| 2016/0321654 A1 | 11/2016 | Lesavich et al. |

FOREIGN PATENT DOCUMENTS

| | | |
|---|---|---|
| WO | PCT/US2015/047229 | 8/2015 |
| WO | WO2016/033345 A1 | 3/2016 |

* cited by examiner

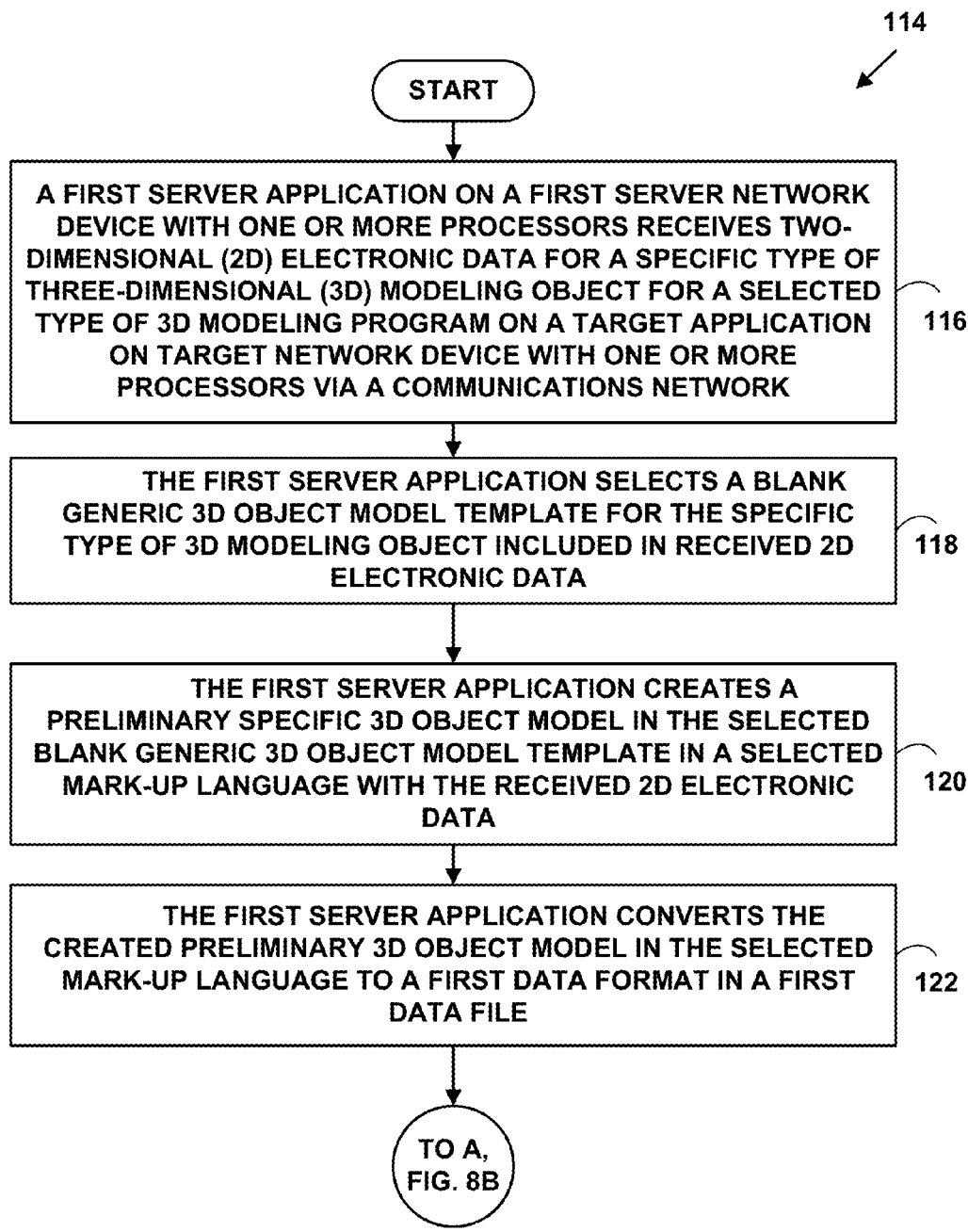

US 9,817,922 B2

METHOD AND SYSTEM FOR CREATING 3D MODELS FROM 2D DATA FOR BUILDING INFORMATION MODELING (BIM)

FIELD OF INVENTION

This invention relates to creating three dimensional models that are used to create actual products. More specifically, it relates to a method and system for creating three dimensional (3D) models from two dimensional (2D) data for building information modeling (BIM).

BACKGROUND OF THE INVENTION

Building Information Modeling (BIM) is a process including the generation and management of digital representations of physical and functional characteristics of physical spaces. Building Information Models (BIMs) are files (often but not always in proprietary formats and containing proprietary data) which can be exchanged or networked to support decision-making.

Current BIM software is used by individuals, businesses and government authorities who plan, design, construct, operate and maintain diverse physical infrastructures, from water, wastewater, electricity, gas, refuse and communication utilities to roads, bridges and ports, from houses, apartments, schools and shops to offices, factories, warehouses and prisons, etc.

However, there are a number of problems associated with creating three dimensional models (3D) from two dimensional (2D) data building information modeling (BIM).

One problem is that poor BIM software interoperability has long been regarded as an obstacle to industry efficiency in general and to BIM adoption in particular. In August 2004 the US National Institute of Standards and Technology (NIST) issued a report which conservatively estimated that $15.8 billion was lost annually by the U.S. capital facilities industry due to inadequate interoperability arising from "the highly fragmented nature of the industry, the industry's continued paper based business practices, a lack of standardization, and inconsistent technology adoption among stakeholders".

Another problem is existing BIM 3D modeling programs cannot be easily extended for new products.

Another problem is that it is not easy to create new 3D models for existing 3D modeling programs.

Another problem is that new 3D models used on one 3D modeling program are not in a format that is directly compatible with a second 3D modeling program.

Another problem is that 3D modeling programs file formats are proprietary and are difficult to create new 3D models for.

There have been attempts to solve some of the problems associated with adding news models for BIM. For example, U.S Published Patent Application US20120215500A1 published by Elisa Ciuti teaches "A method and associated device relate to the enhancement of a digital model of a building using a computer, wherein: a) the digital model is analyzed in order to identify the elements that make up the building and have specific characteristics in the building; b) construction products which have properties that match said characteristics are defined; and c) the digital model is enhanced by adding, for every element that makes up the model, data from at least one list of suitable construction products."

U.S Published Patent Application US20120310906A1 published by Miller et al. teaches "Systems and methods are disclosed for tracking the content of building information models. Embodiments include various computer-implemented methods for the tagging of BIM information, and for the monitoring of modification events involving BIM information. In addition, activities involving physical elements associated with BIM information are tracked. Providers of BIM content can tag content prior to distribution, enabling an internet-based service to track usage, enabling improved service to consumers of that BIM content. Designers can tag BIM content and BIM elements for tracking during the useful life of a building. Internet based messaging protocols can be used for communication between web services, client services and client applications. Monitoring and communication services function unattended. The system includes integration with BIM design applications, as well as stand-alone, end user system applications and browser interfaces. Analytic tools can be used to report on the tracking data."

U.S Published Patent Application US20120310906A1 published by Arnold et al. teaches "A building information management (BIM) system is provided with a library platform that supports a toolset with novel functionality. Embodiments of the invention provide a library of products that can be used in a BIM and provide a virtual product set with improved functionality and more detailed information about the products. The library of products includes virtual products that comprise parametrically described data objects. The toolset includes an editor with which the virtual products can be edited and modified. The library of virtual products can be configured for interoperability with multiple BIM systems."

International Patent Application WO 2011051639 A1 published by Elisa Cuiti teaches "The present invention relates to the enhancement of a digital model of a building using computer means, wherein: a) the digital model is analysed (S1, S3) in order to identify the elements that make up the building and have specific characteristics in the building; b) construction products which have properties that match said characteristics are defined (S5); and c) the digital model is enhanced (S7) by adding, for every element that makes up the model, data from at least one list of suitable construction products."

U.S. Issued U.S. Pat. No. 8,427,473 that issued to Elsberg, et al. teaches "An electronically implemented method of on-site visualization of building information model data, the method constituted of: loading a 3D scene comprising building information model data; receiving real time positional information comprising geographic coordinate information and orientation information; rendering a pseudo-realistic image of the loaded 3D scene responsive to the real time positional information; and displaying the rendered pseudo-realistic image. Preferably the method further provides for displaying engineering information of the building information model responsive to the real time positional information. Preferably, the pseudo-realistic image provides shadowing responsive to real time chronographic information and the received real time positional information."

U.S. Issued U.S. Pat. No. 8,484,231 that issued to Li et al. teaches "A process includes mapping a data format in an object in a source schema to a data format in an object in a destination schema. The process includes defining an attribute mapping, defining a relation between the data format in the object in the source and the data format in the object in the destination, mapping the data format in the object in the source to the data format in the object in the destination, and converting the data format in the object in the source to another data format within the source. When the object in the source has no analog in destination, a foreign object is introduced into the destination, and when the object in the destination refers to one or more dependent objects, one or more instances of referred objects are generated according to a predefined policy in the mapping."

However, none of these solutions solves all of the problems associated with adding new models for BIM.

Thus, it is desirable to solve some of the problems associated creating three dimensional (3D) models from two dimensional (2D) data for BIM.

SUMMARY OF THE INVENTION

In accordance with preferred embodiments of the present invention, some of the problems associated creating three dimensional (3D) models from two dimensional (2D) data for building information modeling (BIM) are overcome. A method and system for a method and system for creating three dimensional (3D) models from two dimensional (2D) data for building information modeling (BIM) is presented.

The method and system allow new, 2D, 3D and higher dimensional models to be created for existing 3D modeling programs (e.g., AUTODESK REVIT, AUTOCAD, VECTORWORKS, MICROSTATION, ARCHICAD, etc.). The new models are used to enhance and extend existing 3D modeling programs. The new models can also be used to directly create physical objects (e.g., windows, doors, etc.) represented by the new models with robots, 3D printers and manufacturing machines.

The foregoing and other features and advantages of preferred embodiments of the present invention will be more readily apparent from the following detailed description. The detailed description proceeds with references to the accompanying drawings.

BRIEF DESCRIPTION OF THE DRAWINGS

Preferred embodiments of the present invention are described with reference to the following drawings, wherein:

FIGS. 8A and 8B are a flow diagram illustrating a method for creating three dimensional (3D) objects from two dimensional (2D) data;

DETAILED DESCRIPTION OF THE INVENTION

Exemplary Cloud Electronic Information Storage and Retrieval System

Figure 1:
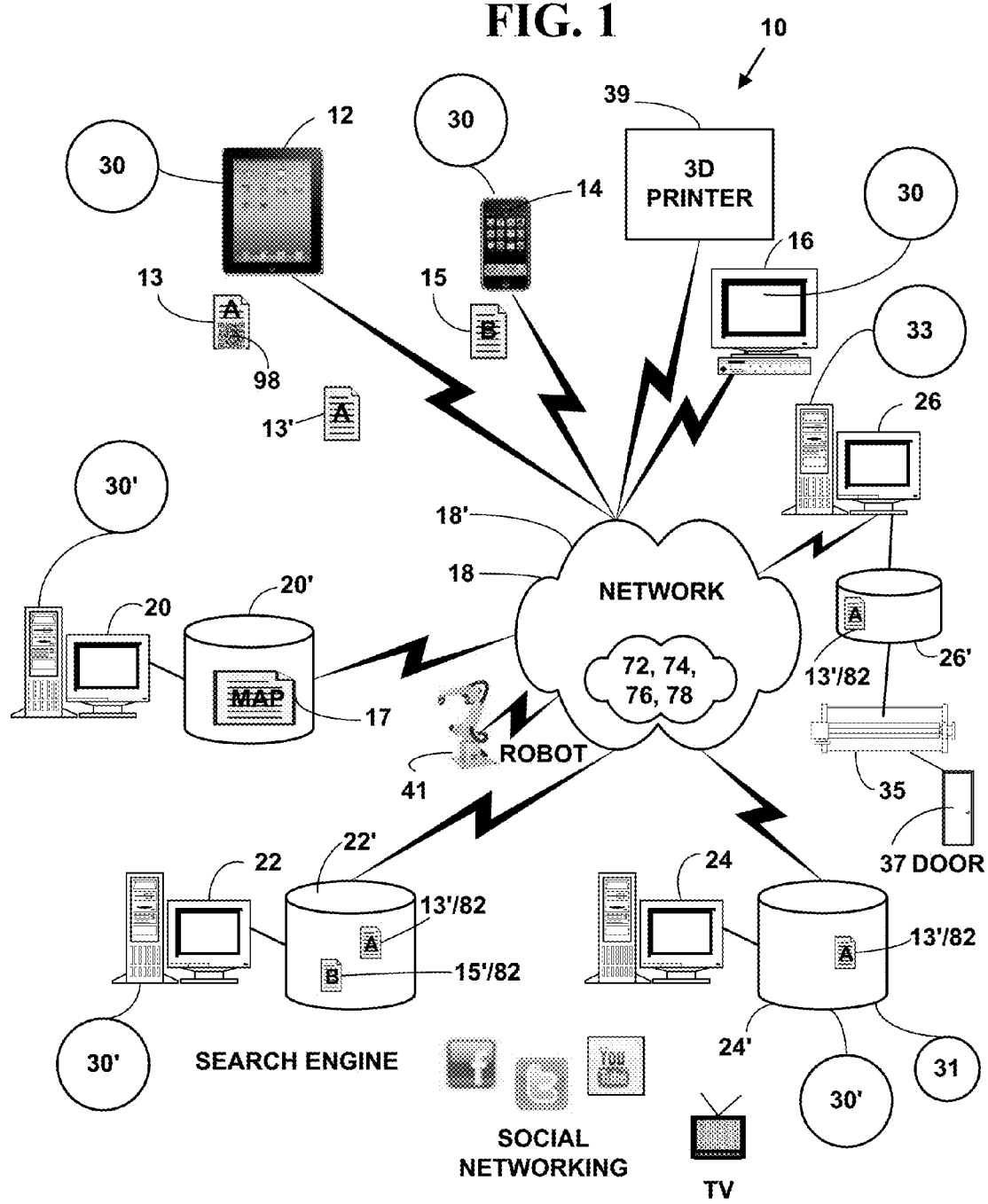
FIG. 1 is a block diagram illustrating an exemplary electronic information display system.

FIG. 1 is a block diagram illustrating an exemplary electronic information display system 10. The exemplary electronic system 10 includes, but is not limited to, one or more target network devices 12, 14, 16 (only three of which are illustrated) each with one or more processors and each with a non-transitory computer readable medium.

The one or more target network devices 12, 14, 16 include, but are not limited to, multimedia capable desktop and laptop computers, tablet computers, facsimile machines, mobile phones, non-mobile phones with and/or without displays, three-dimensional (3D) printer, robots, smart phones, Internet phones, Internet appliances, personal digital/data assistants (PDA), two-way pagers, digital cameras, portable game consoles (Play Station Portable by Sony, Game Boy by Sony, Nintendo DSI, etc.), non-portable game consoles (Xbox by Microsoft, Play Station by Sony, Wii by Nintendo, etc.), cable television (CATV), satellite television (SATV) and Internet television set-top boxes, digital televisions including high definition television (HDTV), three-dimensional (3DTV) televisions, wearable devices and other types of network devices.

The one or more smart network devices 12, 14, 16 include smart phones such as the iPhone by Apple, Inc., Blackberry Storm and other Blackberry models by Research In Motion, Inc. (RIM), Droid by Motorola, Inc. HTC, Inc. other types of smart phones, etc. However, the present invention is not limited to such smart phone devices, and more, fewer or other devices can be used to practice the invention.

A "smart phone" is a mobile phone that offers more advanced computing ability and connectivity than a contemporary basic feature phone. Smart phones and feature phones may be thought of as handheld computers integrated with a mobile telephone, but while most feature phones are able to run applications based on platforms such as Java ME, a smart phone usually allows the user to install and run more advanced applications. Smart phones and/or tablet computers run complete operating system software providing a platform for application developers.

The operating systems include the iPhone OS, Android, Windows, etc. iPhone OS is a proprietary operating system for the Apple iPhone. Android is an open source operating system platform backed by Google, along with major hardware and software developers (such as Intel, HTC, ARM, Motorola and Samsung, etc.), that form the Open Handset Alliance.

The one or more smart network devices 12, 14, 16 include tablet computers such as the iPad, by Apple, Inc., the HP Tablet, by Hewlett Packard, Inc., the Playbook, by RIM, Inc., the Tablet, by Sony, Inc.

A 3D printer 37 (FIG. 1) include 3D printing or "Additive manufacturing." 3D printing is a process of making a three-dimensional solid object of virtually any shape from a digital model. 3D printing is achieved using an "additive process," where successive layers of material are laid down in different shapes. 3D printing is also considered distinct from traditional machining techniques, which mostly rely on the removal of material by methods such as cutting or drilling and are "subtractive" processes.

In one embodiment, a 3D printer 37 is a limited type of industrial robot that is capable of carrying out an additive process under computer control. The 3D printing technology is used for both prototyping and distributed manufacturing with applications in architecture, construction (AEC), industrial design, automotive, aerospace, military, engineering, civil engineering, dental and medical industries, biotech (human tissue replacement), fashion, footwear, jewelry, eyewear, education, geographic information systems, food, and/or many other fields.

The target network devices 12, 14, 16 are in communications with a cloud communications network 18 or a non-cloud computing network 18' via one or more wired and/or wireless communications interfaces. The cloud communications network 18, is also called a "cloud computing network" herein and the terms may be used interchangeably.

The plural target network devices 12, 14, 16 request desired electronic content 13, 15, etc. such as 3D models for specific 3D modeling programs stored on the cloud communications network 18 or non-cloud communications network 18'

The cloud communications network 18 and non-cloud communications network 18' includes, but is not limited to, communications over a wire connected to the target network devices, wireless communications, and other types of communications using one or more communications and/or networking protocols.

Plural server network devices 20, 22, 24, 26 (only four of which are illustrated) each with one or more processors and a non-transitory computer readable medium include one or more associated databases 20', 22', 24', 26'. The plural network devices 20, 22, 24, 26 are in communications with the one or more target devices 12, 14, 16 via the cloud communications network 18 and non-cloud communications network 18'.

Plural server network devices 20, 22, 24, 26 (only four of which are illustrated) are physically located on one more public networks 76 (See FIG. 4), private networks 72, community networks 74 and/or hybrid networks 78 comprising the cloud network 18.

One or more server network devices (e.g., 20, etc.) securely stores one or more cloud content location maps 17 and other plural server network devices (e.g., 22, 24, 26, etc.) store portions 13', 15' of desired electronic content 13, 15 as cloud storage objects 82 (FIG. 5) as is described herein.

The plural server network devices 20, 22, 24 26, include, but are not limited to, manufacturing machines 35, 3D printers 39, robots 41, World Wide Web servers, Internet servers, search engine servers, vertical search engine servers, social networking site servers, file servers, other types of electronic information servers, and other types of server network devices (e.g., edge servers, firewalls, routers, gateways, etc.).

The plural server network devices 20, 22, 24, 26 also include, but are not limited to, network servers used for cloud computing providers, etc.

The cloud communications network 18 and non-cloud communications network 18' includes, but is not limited to, a wired and/or wireless communications network comprising one or more portions of: the Internet, an intranet, a Local Area Network (LAN), a wireless LAN (WiLAN), a Wide Area Network (WAN), a Metropolitan Area Network (MAN), a Public Switched Telephone Network (PSTN), a Wireless Personal Area Network (WPAN) and other types of wired and/or wireless communications networks 18.

The cloud communications network 18 and non-cloud communications network 18' includes one or more gateways, routers, bridges and/or switches. A gateway connects computer networks using different network protocols and/or operating at different transmission capacities. A router receives transmitted messages and forwards them to their correct destinations over the most efficient available route. A bridge is a device that connects networks using the same communications protocols so that information can be passed from one network device to another. A switch is a device that filters and forwards packets between network segments based on some pre-determined sequence (e.g., timing, sequence number, etc.).

An operating environment for the network devices of the exemplary electronic information display system 10 include a processing system with one or more high speed Central Processing Unit(s) (CPU), processors, one or more memories and/or other types of non-transitory computer readable mediums. In accordance with the practices of persons skilled in the art of computer programming, the present invention is described below with reference to acts and symbolic representations of operations or instructions that are performed by the processing system, unless indicated otherwise. Such acts and operations or instructions are referred to as being "computer-executed," "CPU-executed," or "processor-executed."

It will be appreciated that acts and symbolically represented operations or instructions include the manipulation of electrical information by the CPU or processor. An electrical system represents data bits which cause a resulting transformation or reduction of the electrical information or biological information, and the maintenance of data bits at memory locations in a memory system to thereby reconfigure or otherwise alter the CPU's or processor's operation, as well as other processing of information. The memory locations where data bits are maintained are physical locations that have particular electrical, magnetic, optical, or organic properties corresponding to the data bits.

The data bits may also be maintained on a non-transitory computer readable medium including magnetic disks, optical disks, organic memory, and any other volatile (e.g., Random Access Memory (RAM)) or non-volatile (e.g., Read-Only Memory (ROM), flash memory, etc.) mass storage system readable by the CPU. The non-transitory computer readable medium includes cooperating or interconnected computer readable medium, which exist exclusively on the processing system or can be distributed among multiple interconnected processing systems that may be local or remote to the processing system.

Exemplary Electronic Content Display System

Figure 2:
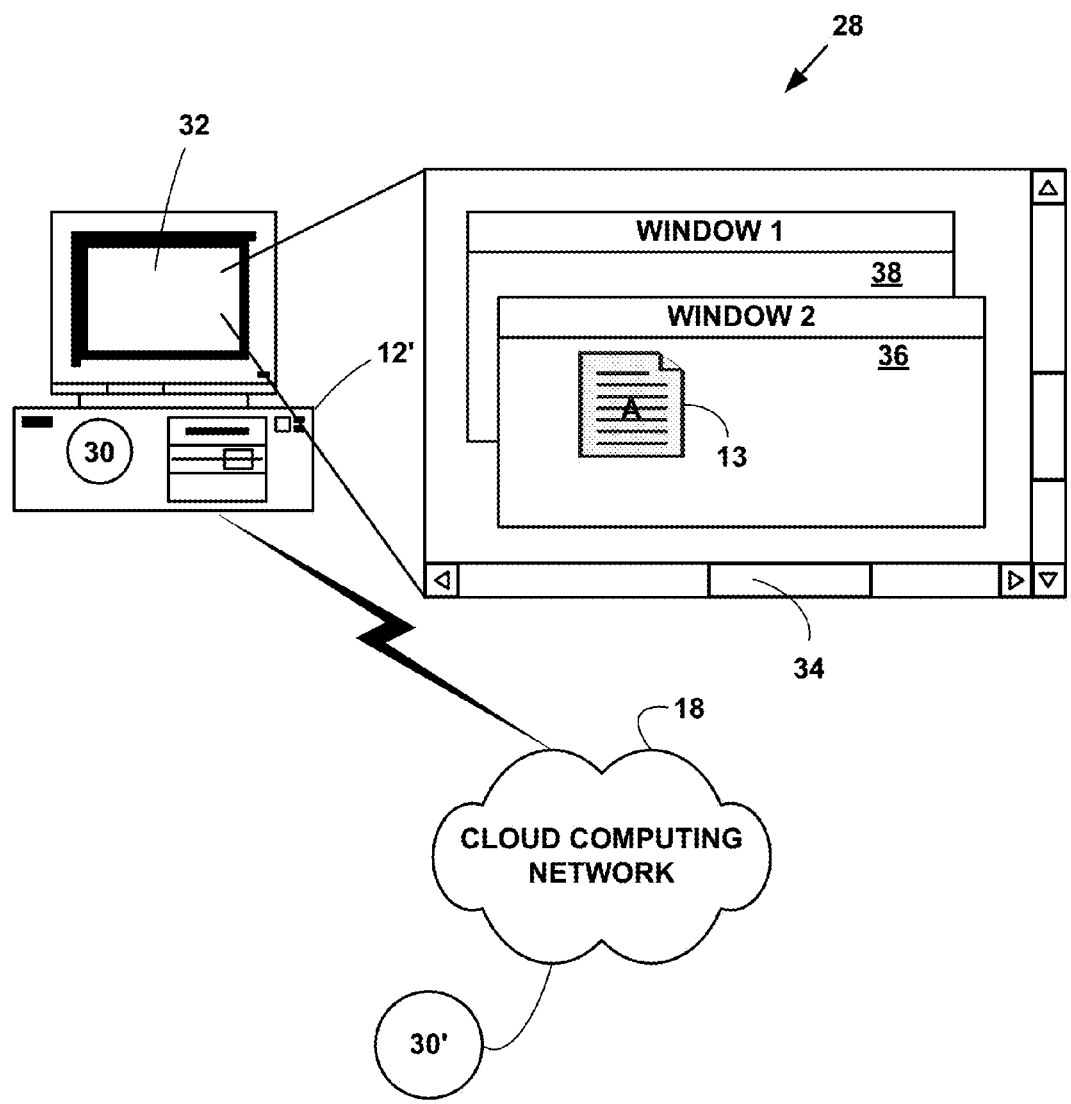
FIG. 2 is a block diagram illustrating an exemplary electronic information display system.

FIG. 2 is a block diagram illustrating an exemplary electronic content information display system 28. The exemplary electronic information system display system 12' includes, but is not limited to a target network device (e.g., 12, etc.) with an application 30 and a display component 32. The application 30 presents a graphical user interface (GUI) 34 on the display 32 component. The GUI 32 presents a multi-window 36, 38, etc. (only two of which are illustrated) interface to a user.

In one embodiment of the invention, the application 30 is a software application. However, the present invention is not limited to this embodiment and the application 30 can be hardware, firmware, hardware and/or any combination thereof. In one embodiment, the application 30 is a mobile application for a smart phone, electronic tablet or other mobile network device. In another embodiment, the application 30, 30' is cloud application used on a cloud communications network 18. However, the present invention is not limited these embodiments and other embodiments can be used to practice the invention In another embodiment, a portion of the application 30 is executing on the target network devices 12, 14, 16 and another portion of the application 30' is executing on the server network devices 20, 22, 24, 26. The applications also include one or more library applications 31. However, the present invention is not limited these embodiments and other embodiments can be used to practice the invention.

Exemplary Networking Protocol Stack

Figure 3:
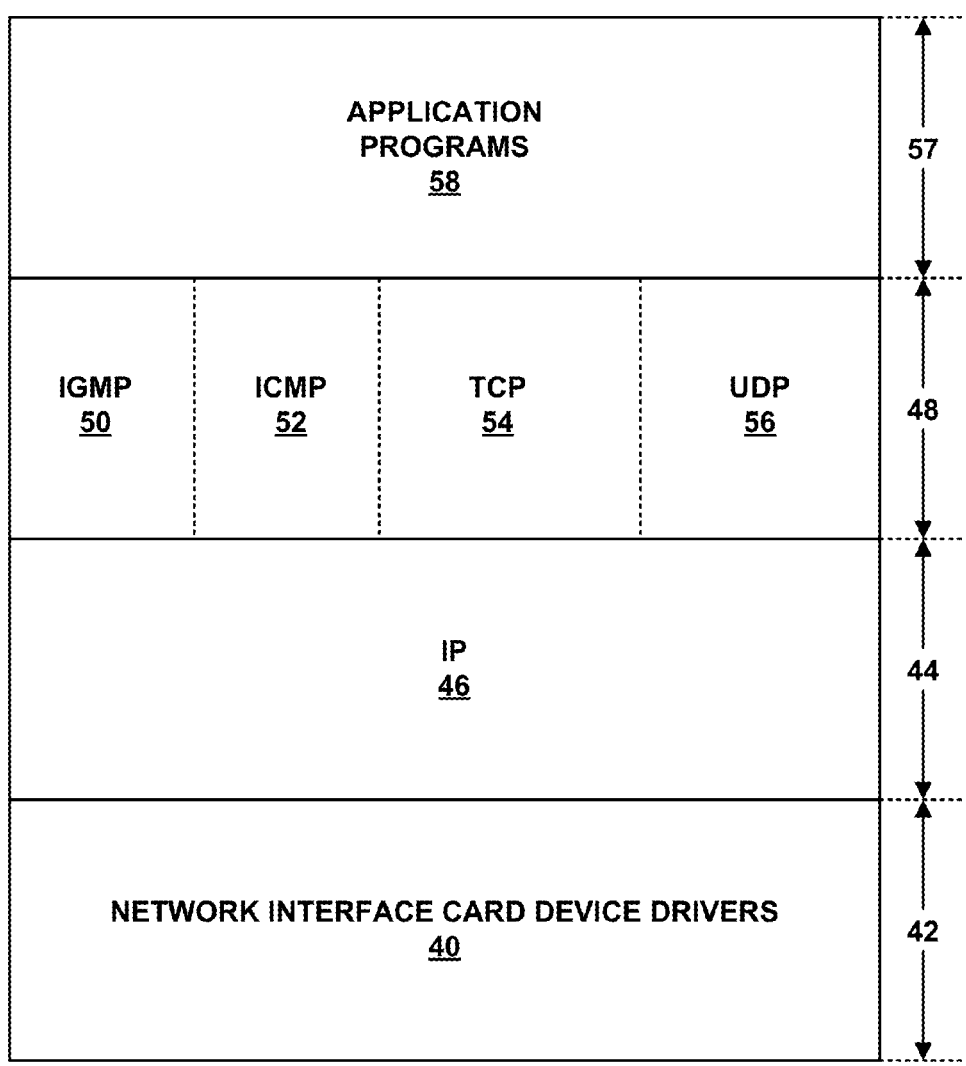
FIG. 3 is a block diagram illustrating an exemplary networking protocol stack.

FIG. 3 a block diagram illustrating a layered protocol stack 38 for network devices in the electronic information display system 10. The layered protocol stack 38 is described with respect to Internet Protocol (IP) suites comprising in general from lowest-to-highest, a link 42, network 44, transport 48 and application 56 layers. However, more or fewer layers could also be used, and different layer designations could also be used for the layers in the protocol stack 38 (e.g., layering based on the Open Systems Interconnection (OSI) model including from lowest-to-highest, a physical, data-link, network, transport, session, presentation and application layer.).

The network devices 12, 14, 16, 20, 22, 24, 26 are connected to the communication network 18 with Network Interface Card (NIC) cards including device drivers 40 in a link layer 42 for the actual hardware connecting the network devices 12, 14, 16, 20, 22, 24, 26 to the cloud communications network 18. For example, the NIC device drivers 40 may include a serial port device driver, a digital subscriber line (DSL) device driver, an Ethernet device driver, a wireless device driver, a wired device driver, etc. The device drivers interface with the actual hardware being used to connect the network devices to the cloud communications network 18. The NIC cards have a medium access control (MAC) address that is unique to each NIC and unique across the whole cloud network 18. The Medium Access Control (MAC) protocol is used to provide a data link layer of an Ethernet LAN system and for other network systems.

Above the link layer 42 is a network layer 44 (also called the Internet Layer for Internet Protocol (IP) suites). The network layer 44 includes, but is not limited to, an IP layer 46.

IP 46 is an addressing protocol designed to route traffic within a network or between networks. However, more fewer or other protocols can also be used in the network layer 44, and the present invention is not limited to IP 46. For more information on IP 54 see IETF RFC-791, incorporated herein by reference.

Above network layer 44 is a transport layer 48. The transport layer 48 includes, but is not limited to, an optional Internet Group Management Protocol (IGMP) layer 50, a Internet Control Message Protocol (ICMP) layer 52, a Transmission Control Protocol (TCP) layer 52 and a User Datagram Protocol (UDP) layer 54. However, more, fewer or other protocols could also be used in the transport layer 48.

Optional IGMP layer 50, hereinafter IGMP 50, is responsible for multicasting. For more information on IGMP 50 see RFC-1112, incorporated herein by reference. ICMP layer 52, hereinafter ICMP 52 is used for IP 46 control. The main functions of ICMP 52 include error reporting, reachability testing (e.g., pinging, etc.), route-change notification, performance, subnet addressing and other maintenance. For more information on ICMP 52 see RFC-792, incorporated herein by reference. Both IGMP 50 and ICMP 52 are not required in the protocol stack 38. ICMP 52 can be used alone without optional IGMP layer 50.

TCP layer 54, hereinafter TCP 54, provides a connection-oriented, end-to-end reliable protocol designed to fit into a layered hierarchy of protocols which support multi-network applications. TCP 54 provides for reliable inter-process communication between pairs of processes in network devices attached to distinct but interconnected networks. For more information on TCP 54 see RFC-793, incorporated herein by reference.

UDP layer 56, hereinafter UDP 56, provides a connectionless mode of communications with datagrams in an interconnected set of computer networks. UDP 54 provides a transaction oriented datagram protocol, where delivery and duplicate packet protection are not guaranteed. For more information on UDP 56 see RFC-768, incorporated herein by reference. Both TCP 54 and UDP 56 are not required in protocol stack 38. Either TCP 54 or UDP 56 can be used without the other.

Above transport layer 48 is an application layer 57 where application programs 58 (e.g., 30, 30', etc.) to carry out desired functionality for a network device reside. For example, the application programs 58 for the client network devices 12, 14, 16 may include web-browsers or other application programs, application program 30, while application programs for the server network devices 20, 22, 24, 26 may include other application programs (e.g., 30', etc.).

However, the protocol stack 38 is not limited to the protocol layers illustrated and more, fewer or other layers and protocols can also be used in protocol stack 38. In addition, other protocols from the Internet Protocol suites (e.g., Simple Mail Transfer Protocol, (SMTP), Hyper Text Transfer Protocol (HTTP), File Transfer Protocol (FTP), Dynamic Host Configuration Protocol (DHCP), DNS, etc.) and/or other protocols from other protocol suites may also be used in protocol stack 38.

In addition, markup languages such as HyperText Markup Language (HTML), EXtensible Markup Language (XML) and others are used.

HyperText Markup Language (HTML) is a markup language for creating web pages and other information that can be displayed in a web browser.

HTML is written in the form of HTML elements consisting of tags enclosed in angle brackets within the web page content. HTML tags most commonly come in pairs although some tags represent empty elements and so are unpaired. The first tag in a pair is the start tag, and the second tag is the end tag (they are also called opening tags and closing tags). In between these tags web designers can add text, further tags, comments and other types of text-based content.

The purpose of a web browser is to read HTML documents and compose them into visible or audible web pages. The browser does not display the HTML tags, but uses the tags to interpret the content of the page.

HTML elements form the building blocks of all websites. HTML allows images and objects to be embedded and can be used to create interactive forms. It provides a means to create structured documents by denoting structural semantics for text such as headings, paragraphs, lists, links, quotes and other items. It can embed scripts written in languages such as JavaScript which affect the behavior of HTML web pages.

EXtensible Markup Language (XML) is another markup language that defines a set of rules for encoding documents in a format that is both human-readable and machine-readable. It is defined in the XML 1.0 Specification produced by the W3C, the contents of which are incorporated by reference and several other related specifications, all free open standards.

XML a textual data format with strong support via Unicode for the languages of the world. Although the design of XML focuses on documents, it is widely used for the representation of arbitrary data structures, for example in web services. The oldest schema language for XML is the Document Type Definition (DTD). DTDs within XML documents define entities, which are arbitrary fragments of text and/or markup tags that the XML processor inserts in the DTD itself and in the XML document wherever they are referenced, like character escapes.

Preferred embodiments of the present invention include network devices and wired and wireless interfaces that are compliant with all or part of standards proposed by the Institute of Electrical and Electronic Engineers (IEEE), International Telecommunications Union-Telecommunication Standardization Sector (ITU), European Telecommunications Standards Institute (ETSI), Internet Engineering Task Force (IETF), U.S. National Institute of Security Technology (NIST), American National Standard Institute (ANSI), Wireless Application Protocol (WAP) Forum, Bluetooth Forum, or the ADSL Forum.

Wireless Interfaces

In one embodiment of the present invention, the wireless interfaces on network devices 12, 14, 16, 20, 22, 24, 26 include but are not limited to, 3G and/or 4G IEEE 802.11a, 802.11b, 802.11g, 802.11n, 802.15.4 (ZigBee), "Wireless Fidelity" (Wi-Fi), "Worldwide Interoperability for Microwave Access" (WiMAX), ETSI High Performance Radio Metropolitan Area Network (HIPERMAN) or "RF Home" wireless interfaces. In another embodiment of the present invention, the wireless sensor device may include an integral or separate Bluetooth and/or infra data association (IrDA) module for wireless Bluetooth or wireless infrared communications. However, the present invention is not limited to such an embodiment and other 802.11xx and other types of wireless interfaces can also be used.

802.11b is a short-range wireless network standard. The IEEE 802.11b standard defines wireless interfaces that provide up to 11 Mbps wireless data transmission to and from wireless devices over short ranges. 802.11a is an extension of the 802.11b and can deliver speeds up to 54M bps. 802.11g deliver speeds on par with 802.11a. However, other 802.11XX interfaces can also be used and the present invention is not limited to the 802.11 protocols defined. The IEEE 802.11a, 802.11b and 802.11g standards are incorporated herein by reference.

Wi-Fi is a type of 802.11xx interface, whether 802.11b, 802.11a, dual-band, etc. Wi-Fi devices include an RF interfaces such as 2.4 GHz for 802.11b or 802.11g and 5 GHz for 802.11a.

802.15.4 (Zigbee) is low data rate network standard used for mesh network devices such as sensors, interactive toys, smart badges, remote controls, and home automation. The 802.15.4 standard provides data rates of 250 kbps, 40 kbps, and 20 kbps., two addressing modes; 16-bit short and 64-bit IEEE addressing, support for critical latency devices, such as joysticks, Carrier Sense Multiple Access/Collision Avoidance, (CSMA-CA) channel access, automatic network establishment by a coordinator, a full handshake protocol for transfer reliability, power management to ensure low power consumption for multi-month to multi-year battery usage and up to 16 channels in the 2.4 GHz Industrial, Scientific and Medical (ISM) band (Worldwide), 10 channels in the 915 MHz (US) and one channel in the 868 MHz band (Europe). The IEEE 802.15.4-2003 standard is incorporated herein by reference.

WiMAX is an industry trade organization formed by leading communications component and equipment companies to promote and certify compatibility and interoperability of broadband wireless access equipment that conforms to the IEEE 802.16XX and ETSI HIPERMAN. HIPERMAN is the European standard for metropolitan area networks (MAN).

The IEEE The 802.16a and 802.16g standards are wireless MAN technology standard that provides a wireless alternative to cable, DSL and T1/E1 for last mile broadband access. It is also used as complimentary technology to connect IEEE 802.11XX hot spots to the Internet.

The IEEE 802.16a standard for 2-11 GHz is a wireless MAN technology that provides broadband wireless connectivity to fixed, portable and nomadic devices. It provides up to 50-kilometers of service area range, allows users to get broadband connectivity without needing direct line of sight with the base station, and provides total data rates of up to 280 Mbps per base station, which is enough bandwidth to simultaneously support hundreds of businesses with T1/E1-type connectivity and thousands of homes with DSL-type connectivity with a single base station. The IEEE 802.16g provides up to 100 Mbps.

The IEEE 802.16e standard is an extension to the approved IEEE 802.16/16a/16g standard. The purpose of 802.16e is to add limited mobility to the current standard which is designed for fixed operation.

The ESTI HIPERMAN standard is an interoperable broadband fixed wireless access standard for systems operating at radio frequencies between 2 GHz and 11 GHz.

The IEEE 802.16a, 802.16e and 802.16g standards are incorporated herein by reference. WiMAX can be used to provide a WLP.

The ETSI HIPERMAN standards TR 101 031, TR 101 475, TR 101 493-1 through TR 101 493-3, TR 101 761-1 through TR 101 761-4, TR 101 762, TR 101 763-1 through TR 101 763-3 and TR 101 957 are incorporated herein by reference. ETSI HIPERMAN can be used to provide a WLP.

In one embodiment, the plural server network devices 20, 22, 24, 26 include a connection to plural network interface cards (NICs) in a backplane connected to a communications bus. The NIC cards provide gigabit/second ($1 \times 10^9$ bits/second) communications speed of electronic information. This allows "scaling out" for fast electronic content retrieval. The NICs are connected to the plural server network devices 20, 22, 24, 26 and the cloud communications network 18. However, the present invention is not limited to the NICs described and other types of NICs in other configurations and connections with and/or without buses can also be used to practice the invention.

In one embodiment, network devices 12, 14, 16, 20, 22, 24, 26 and wired and wireless interfaces including the NICs include "4G" components. "4G" refers to the fourth generation of wireless communications standards and speeds of 100 megabits/second to gigabits/second or more. 4G includes peak speed requirements for 4G service at least 100 Mbit/s for high mobility communication (e.g., trains, vehicles, etc.) and 1 Gbit/s for low mobility communication (e.g., pedestrians and stationary users, etc.).

4G technologies are a successor to 3G and 2G standards. The nomenclature of the generations generally refers to a change in the fundamental nature of the service. The first was the move from analogue (1G) to digital (2G) transmission. This was followed by multi-media support, spread spectrum transmission and at least 200 Kbits/second (3G). The 4G NICs include IP packet-switched NICs, wired and wireless ultra-broadband (i.e., gigabit speed) access NICs, Worldwide Interoperability for Microwave Access (Wi-MAX) NICs WiMAX Long Term Evolution (LTE) and/or multi-carrier transmission NICs. However, the present invention is not limited to this embodiment and 1G, 2G and 3G and/or any combination thereof, with or with 4G NICs can be used to practice the invention.

In one embodiment of the invention, the WiMAX interface includes WiMAX 4G Long Term Evolution (LTE) interfaces. The ITU announced in December 2010 that WiMAX and LTE are 4G technologies. One of the benefits of 4G LTE is the ability to take advantage of advanced topology networks including those on cloud communications networks 18 such as optimized heterogeneous networks with a mix of macrocells with low power nodes such as picocells, femtocells and new relay nodes. LTE further improves the capacity and coverage, and helps ensures user fairness. 4G LTE also introduces multicarrier technologies for ultra-wide bandwidth use, up to 100 MHz of spectrum supporting very high data rates.

In one embodiment, of the invention, the wireless interfaces also include wireless personal area network (WPAN) interfaces. As is known in the art, a WPAN is a personal area network for interconnecting devices centered around an individual person's devices in which the connections are wireless. A WPAN interconnects all the ordinary computing and communicating devices that a person has on their desk (e.g. computer, etc.) or carry with them (e.g., PDA, mobile phone, smart phone, table computer two-way pager, etc.)

A key concept in WPAN technology is known as "plugging in." In the ideal scenario, when any two WPAN-equipped devices come into close proximity (within several meters and/or feet of each other) or within a few miles and/or kilometers of a central server (not illustrated), they can communicate via wireless communications as if connected by a cable. WPAN devices can also lock out other devices selectively, preventing needless interference or unauthorized access to secure information. Zigbee is one wireless protocol used on WPAN networks such as cloud communications network 18 or non-cloud communications network 18'.

The one or more target network devices 12, 14, 16 and one or more server network devices 20, 22, 24, 26 communicate with each other and other network devices with near field communications (NFC) and/or machine-to-machine (M2M) communications.

"Near field communication (NFC)" is a set of standards for smartphones and similar network devices to establish radio communication with each other by touching them together or bringing them into close proximity, usually no more than a few centimeters. Present applications include contactless transactions, data exchange, and simplified setup of more complex communications such as Wi-Fi. Communication is also possible between an NFC device and an unpowered NFC chip, called a "tag" including radio frequency identifier (RFID) tags 99 and/or sensor.

NFC standards cover communications protocols and data exchange formats, and are based on existing radio-frequency identification (RFID) standards including ISO/IEC 14443 and FeliCa. These standards include ISO/IEC 1809 and those defined by the NFC Forum, all of which are incorporated by reference.

An "RFID tag" 99 is an object that can be applied to or incorporated into a product, animal, or person for the purpose of identification and/or tracking using RF signals.

An "RFID sensor" is a device that measures a physical quantity and converts it into an RF signal which can be read by an observer or by an instrument (e.g., target network devices 12, 14, 16, server network devices 20, 22, 24, 26, etc.)

"Machine to machine (M2M)" refers to technologies that allow both wireless and wired systems to communicate with other devices of the same ability. M2M uses a device to capture an event (such as option purchase, etc.), which is relayed through a network (wireless, wired cloud, etc.) to an application (software program), that translates the captured event into meaningful information. Such communication was originally accomplished by having a remote network of machines relay information back to a central hub for analysis, which would then be rerouted into a system like a personal computer.

However, modern M2M communication has expanded beyond a one-to-one connection and changed into a system of networks that transmits data many-to-one and many-to-many to plural different types of devices and appliances. The expansion of IP networks across the world has made it far easier for M2M communication to take place and has lessened the amount of power and time necessary for information to be communicated between machines.

However, the present invention is not limited to such wireless interfaces and wireless networks and more, fewer and/or other wireless interfaces can be used to practice the invention.

Wired Interfaces

In one embodiment of the present invention, the wired interfaces include wired interfaces and corresponding networking protocols for wired connections to the Public Switched Telephone Network (PSTN) and/or a cable television network (CATV) and/or satellite television networks (SATV) and/or three-dimensional television (3DTV), including HDTV that connect the network devices 12, 14, 16, 20, 22, 24, 26 via one or more twisted pairs of copper wires, digital subscriber lines (e.g. DSL, ADSL, VDSL, etc.) coaxial cable, fiber optic cable, other connection media or other connection interfaces. The PSTN is any public switched telephone network provided by AT&T, GTE, Sprint, MCI, SBC, Verizon and others. The CATV is any cable television network provided by the Comcast, Time Warner, etc. However, the present invention is not limited to such wired interfaces and more, fewer and/or other wired interfaces can be used to practice the invention.

Television Services

In one embodiment, the cloud applications 30, 30' provide cloud electronic content storage and retrieval services from television services over the cloud communications network 18 or non-cloud communications network 18'. The television services include digital television services, including, but not limited to, cable television, satellite television, high-definition television, three-dimensional, televisions and other types of network devices.

However, the present invention is not limited to such television services and more, fewer and/or other television services can be used to practice the invention.

Internet Television Services

In one embodiment, the cloud applications 30, 30' provide cloud electronic content storage and retrieval services from Internet television services over the cloud communications network 18 or non-cloud communications network 18' The television services include Internet television, Web-TV, and/or Internet Protocol Television (IPtv) and/or other broadcast television services.

"Internet television" allows users to choose a program or the television show they want to watch from an archive of programs or from a channel directory. The two forms of viewing Internet television are streaming content directly to a media player or simply downloading a program to a viewer's set-top box, game console, computer, or other network device.

"Web-TV" delivers digital content via broadband and mobile networks. The digital content is streamed to a viewer's set-top box, game console, computer, or other network device.

"Internet Protocol television (IPtv)" is a system through which Internet television services are delivered using the architecture and networking methods of the Internet Protocol Suite over a packet-switched network infrastructure, e.g., the Internet and broadband Internet access networks, instead of being delivered through traditional radio frequency broadcast, satellite signal, and cable television formats.

However, the present invention is not limited to such Internet Television services and more, fewer and/or other Internet Television services can be used to practice the invention.

General Search Engine Services

In one embodiment, the cloud applications 30, 30' provide cloud electronic content storage and retrieval services from general search engine services. A search engine is designed to search for information on a cloud communications network 18 or non-cloud communications network 18' such as the Internet including World Wide Web servers, HTTP, FTP servers etc. The search results are generally presented in a list of electronic results. The information may consist of web pages, images, electronic information, multimedia information, and other types of files. Some search engines also mine data available in databases or open directories. Unlike web directories, which are maintained by human editors, search engines typically operate algorithmically and/or are a mixture of algorithmic and human input.

In one embodiment, the cloud applications 30, 30' provide cloud electronic content storage and retrieval services from general search engine services. In another embodiment, the cloud applications 30, 30' provide general search engine services by interacting with one or more other public search engines (e.g., GOOGLE, BING, YAHOO, etc.) and/or private search engine services.

In another embodiment, the cloud applications 30, 30' provide electronic content storage and retrieval services from specialized search engine services, such as vertical search engine services by interacting with one or more other public vertical search engines (e.g., GALAXY.COM, etc.) and/or private search engine services.

However, the present invention is not limited to such general and/or vertical search engine services and more, fewer and/or other general search engine services can be used to practice the invention.

Social Networking Services

In one embodiment, the cloud applications 30, 30' provide cloud electronic content storage and retrieval services from one more social networking services including to/from one or more social networking web-sites (e.g., FACEBOOK, YOUTUBE, TWITTER, MY-SPACE, MATCH.COM, E-HARMONY, GROUP ON, SOCIAL LIVING, etc.). The social networking web-sites also include, but are not limited to, social couponing sites, dating web-sites, blogs, RSS feeds, and other types of information web-sites in which messages can be left or posted for a variety of social activities.

However, the present invention is not limited to the social networking services described and other public and private social networking services can also be used to practice the invention.

Security and Encryption

Network devices 12, 14, 16, 20, 22, 24, 26 with wired and/or wireless interfaces of the present invention include one or more of the security and encryptions techniques discussed herein for secure communications on the cloud communications network 18 or non-cloud communications network 18'.

Application programs 58 (FIG. 2) include security and/or encryption application programs integral to and/or separate from the applications 30, 30' Security and/or encryption programs may also exist in hardware components on the network devices (12, 14, 16, 20, 22, 24, 26) described herein and/or exist in a combination of hardware, software and/or firmware.

Wireless Encryption Protocol (WEP) (also called "Wired Equivalent Privacy) is a security protocol for WiLANs defined in the IEEE 802.11b standard. WEP is cryptographic privacy algorithm, based on the Rivest Cipher 4 (RC4) encryption engine, used to provide confidentiality for 802.11b wireless data.

RC4 is cipher designed by RSA Data Security, Inc. of Bedford, Mass., which can accept encryption keys of arbitrary length, and is essentially a pseudo random number generator with an output of the generator being XORed with a data stream to produce encrypted data.

One problem with WEP is that it is used at the two lowest layers of the OSI model, the physical layer and the data link layer, therefore, it does not offer end-to-end security. One another problem with WEP is that its encryption keys are static rather than dynamic. To update WEP encryption keys, an individual has to manually update a WEP key. WEP also typically uses 40-bit static keys for encryption and thus provides "weak encryption," making a WEP device a target of hackers.

The IEEE 802.11 Working Group is working on a security upgrade for the 802.11 standard called "802.11i." This supplemental draft standard is intended to improve WiLAN security. It describes the encrypted transmission of data between systems 802.11X WiLANs. It also defines new encryption key protocols including the Temporal Key Integrity Protocol (TKIP). The IEEE 802.11i draft standard, version 4, completed Jun. 6, 2003, is incorporated herein by reference.

The 802.11i standard is based on 802.1x port-based authentication for user and device authentication. The 802.11i standard includes two main developments: Wi-Fi Protected Access (WPA) and Robust Security Network (RSN).

WPA uses the same RC4 underlying encryption algorithm as WEP. However, WPA uses TKIP to improve security of keys used with WEP. WPA keys are derived and rotated more often than WEP keys and thus provide additional security. WPA also adds a message-integrity-check function to prevent packet forgeries.

RSN uses dynamic negotiation of authentication and selectable encryption algorithms between wireless access points and wireless devices. The authentication schemes proposed in the draft standard include Extensible Authentication Protocol (EAP). One proposed encryption algorithm is an Advanced Encryption Standard (AES) encryption algorithm.

Dynamic negotiation of authentication and encryption algorithms lets RSN evolve with the state of the art in security, adding algorithms to address new threats and continuing to provide the security necessary to protect information that WiLANs carry.

The NIST developed a new encryption standard, the Advanced Encryption Standard (AES) to keep government information secure. AES is intended to be a stronger, more efficient successor to Triple Data Encryption Standard (3DES).

DES is a popular symmetric-key encryption method developed in 1975 and standardized by ANSI in 1981 as ANSI X.3.92, the contents of which are incorporated herein by reference. As is known in the art, 3DES is the encrypt-decrypt-encrypt (EDE) mode of the DES cipher algorithm. 3DES is defined in the ANSI standard, ANSI X9.52-1998, the contents of which are incorporated herein by reference. DES modes of operation are used in conjunction with the NIST Federal Information Processing Standard (FIPS) for data encryption (FIPS 46-3, October 1999), the contents of which are incorporated herein by reference.

The NIST approved a FIPS for the AES, FIPS-197. This standard specified "Rijndael" encryption as a FIPS-approved symmetric encryption algorithm that may be used by U.S. Government organizations (and others) to protect sensitive information. The NIST FIPS-197 standard (AES FIPS PUB 197, November 2001) is incorporated herein by reference.

The NIST approved a FIPS for U.S. Federal Government requirements for information technology products for sensitive but unclassified (SBU) communications. The NIST FIPS Security Requirements for Cryptographic Modules (FIPS PUB 140-2, May 2001) is incorporated herein by reference.

RSA is a public key encryption system which can be used both for encrypting messages and making digital signatures. The letters RSA stand for the names of the inventors: Rivest, Shamir and Adleman. For more information on RSA, see U.S. Pat. No. 4,405,829, now expired and incorporated herein by reference.

"Hashing" is the transformation of a string of characters into a usually shorter fixed-length value or key that represents the original string. Hashing is used to index and retrieve items in a database because it is faster to find the item using the shorter hashed key than to find it using the original value. It is also used in many encryption algorithms.

Secure Hash Algorithm (SHA), is used for computing a secure condensed representation of a data message or a data file. When a message of any length $<2^{64}$ bits is input, the SHA-1 produces a 160-bit output called a "message digest." The message digest can then be input to other security techniques such as encryption, a Digital Signature Algorithm (DSA) and others which generates or verifies a security mechanism for the message. SHA-512 outputs a 512-bit message digest. The Secure Hash Standard, FIPS PUB 180-1, Apr. 17, 1995, is incorporated herein by reference.

Message Digest-5 (MD-5) takes as input a message of arbitrary length and produces as output a 128-bit "message digest" of the input. The MD5 algorithm is intended for digital signature applications, where a large file must be "compressed" in a secure manner before being encrypted with a private (secret) key under a public-key cryptosystem such as RSA. The IETF RFC-1321, entitled "The MD5 Message-Digest Algorithm" is incorporated here by reference.

Providing a way to check the integrity of information transmitted over or stored in an unreliable medium such as a wireless network is a prime necessity in the world of open computing and communications. Mechanisms that provide such integrity check based on a secret key are called "message authentication codes" (MAC). Typically, message authentication codes are used between two parties that share a secret key in order to validate information transmitted between these parties.

Keyed Hashing for Message Authentication Codes (HMAC), is a mechanism for message authentication using cryptographic hash functions. HMAC is used with any iterative cryptographic hash function, e.g., MD5, SHA-1, SHA-512, etc. in combination with a secret shared key. The cryptographic strength of HMAC depends on the properties of the underlying hash function. The IETF RFC-2101, entitled "HMAC: Keyed-Hashing for Message Authentication" is incorporated here by reference.

An Electronic Code Book (ECB) is a mode of operation for a "block cipher," with the characteristic that each possible block of plaintext has a defined corresponding cipher text value and vice versa. In other words, the same plaintext value will always result in the same cipher text value. Electronic Code Book is used when a volume of plaintext is separated into several blocks of data, each of which is then encrypted independently of other blocks. The Electronic Code Book has the ability to support a separate encryption key for each block type.

Diffie and Hellman (DH) describe several different group methods for two parties to agree upon a shared secret in such a way that the secret will be unavailable to eavesdroppers. This secret is then converted into various types of cryptographic keys. A large number of the variants of the DH method exist including ANSI X9.42. The IETF RFC-2631, entitled "Diffie-Hellman Key Agreement Method" is incorporated here by reference.

The HyperText Transport Protocol (HTTP) Secure (HTTPs), is a standard for encrypted communications on the World Wide Web. HTTPs is actually just HTTP over a Secure Sockets Layer (SSL). For more information on HTTP, see IETF RFC-2616 incorporated herein by reference.

The SSL protocol is a protocol layer which may be placed between a reliable connection-oriented network layer protocol (e.g. TCP/IP) and the application protocol layer (e.g. HTTP). SSL provides for secure communication between a source and destination by allowing mutual authentication, the use of digital signatures for integrity, and encryption for privacy.

The SSL protocol is designed to support a range of choices for specific security methods used for cryptography, message digests, and digital signatures. The security methods are negotiated between the source and destination at the start of establishing a protocol session. The SSL 2.0 protocol specification, by Kipp E. B. Hickman, 1995 is incorporated herein by reference. More information on SSL is available at the domain name See "netscape.com/eng/security/SSL_2.html."

Transport Layer Security (TLS) provides communications privacy over the Internet. The protocol allows client/server applications to communicate over a transport layer (e.g., TCP) in a way that is designed to prevent eavesdropping, tampering, or message forgery. For more information on TLS see IETF RFC-2246, incorporated herein by reference.

In one embodiment, the security functionality includes Cisco Compatible EXtensions (CCX). CCX includes security specifications for makers of 802.11xx wireless LAN chips for ensuring compliance with Cisco's proprietary wireless security LAN protocols. As is known in the art, Cisco Systems, Inc. of San Jose, Calif. is supplier of networking hardware and software, including router and security products.

However, the present invention is not limited to such security and encryption methods described herein and more, fewer and/or other types of security and encryption methods can be used to practice the invention. The security and encryption methods described herein can also be used in various combinations and/or in different layers of the protocol stack 38 with each other.

Cloud Computing Networks

Figure 4:
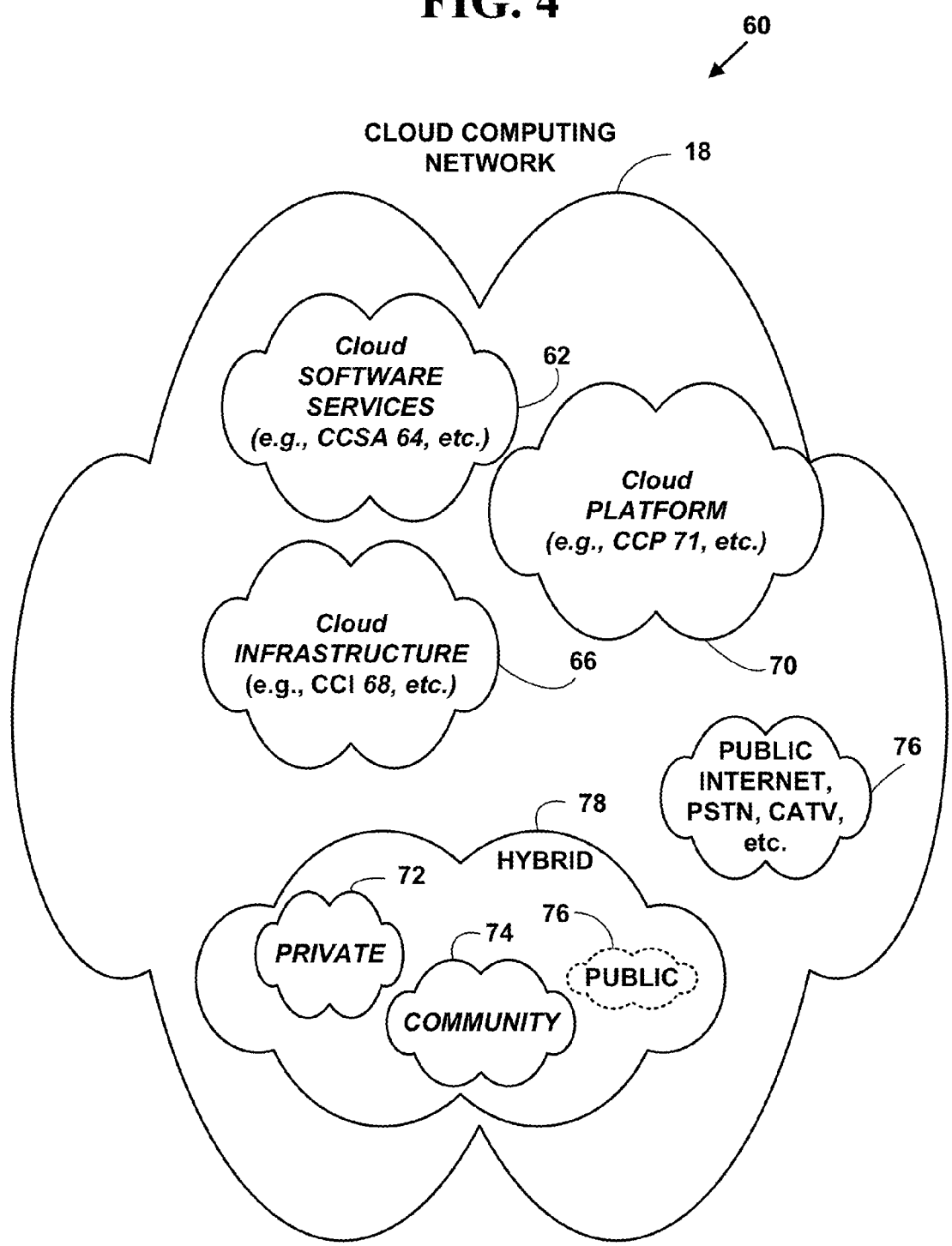
FIG. 4 is block diagram illustrating an exemplary cloud communications network.

FIG. 4 is a block diagram 60 illustrating an exemplary cloud computing network 18. The cloud computing network 18 is also referred to as a "cloud communications network" 18. However, the present invention is not limited to this cloud computing model and other cloud computing models can also be used to practice the invention. The exemplary cloud communications network includes both wired and/or wireless components of public and private networks.

In one embodiment, the cloud computing network 18 includes a cloud communications network 18 comprising plural different cloud component networks 72, 74, 76, 78. "Cloud computing" is a model for enabling, on-demand network access to a shared pool of configurable computing resources (e.g., public and private networks, servers, storage, applications, and services) that are shared, rapidly provisioned and released with minimal management effort or service provider interaction.

This exemplary cloud computing model for electronic information retrieval promotes availability for shared resources and comprises: (1) cloud computing essential characteristics; (2) cloud computing service models; and (3) cloud computing deployment models. However, the present invention is not limited to this cloud computing model and other cloud computing models can also be used to practice the invention.

Exemplary cloud computing essential characteristics appear in Table 1. However, the present invention is not limited to these essential characteristics and more, fewer or other characteristics can also be used to practice the invention.

TABLE 1

1. On-demand 2D to 3D data modeling conversion services. 2D to 3D data
modeling converters can unilaterally provision computing capabilities,
such as server time and network storage, as needed automatically without
requiring human interaction with each network server on the cloud
communications network 18.
2. Broadband network access. 2D to 3D data modeling conversion
capabilities are available over plural broadband communications
networks and accessed through standard mechanisms that promote use by
heterogeneous thin or thick client platforms (e.g., mobile phones, smart
phones 14, tablet computers 12, laptops, PDAs, etc.). The broadband
network access includes high speed network access such as 3G and/or 4G
wireless and/or wired and broadband and/or ultra-broad band (e.g.,
WiMAX, etc.) network access.
3. Resource pooling. 2D to 3D data modeling conversion computing
resources are pooled to serve multiple requesters using a multi-tenant
model, with different physical and virtual resources dynamically assigned
and reassigned according to electronic content retrieval demand. There is
location independence in that a requester of 2D to 3D data modeling
conversion services has no control and/ or knowledge over the exact
location of the provided by the 2D to 3D data modeling conversion
resources but may be able to specify location at a higher level of
abstraction (e.g., country, state, or data center). Examples of pooled
resources include storage, memory, processing, network bandwidth,
virtual server network device and virtual target network devices.
4. Rapid elasticity. Capabilities can be rapidly and elastically provisioned,
in some cases automatically, to quickly scale out and rapidly released to
quickly scale for 2D to 3D data modeling conversion. For 2D to 3D data
modeling converters, the 2D to 3D data modeling conversion capabilities
available for provisioning appear to be unlimited and can be used in any
quantity at any time.
5. Measured Services. Cloud computing systems automatically control and
optimize resource use by leveraging a metering capability at some level of
abstraction appropriate to the type of 2D to 3D data modeling conversion
service (e.g., storage, processing, bandwidth, custom electronic content
retrieval applications, etc.). Electronic 2D to 3D data modeling
conversion usage is monitored, controlled, and reported providing TABLE 1-continued transparency for both the 2D to 3D data modeling conversion provider and
the 2D to 3D data modeling conversion requester of the utilized electronic
content storage retrieval service.

Exemplary cloud computing service models illustrated in FIG. 4 appear in Table 2. However, the present invention is not limited to these service models and more, fewer or other service models can also be used to practice the invention.

TABLE 2

1. Cloud Computing Software Applications 62 for a 2D to 3D data
modeling conversion Service (CCSA 64). The capability to use the
provider's applications 30, 30' running on a cloud infrastructure
66. The cloud computing applications 62, are accessible from the server
network device 20 from various client devices 12, 14, 16 through a thin
client interface such as a web browser, etc. The user does not manage or
control the underlying cloud infrastructure 66 including network, servers,
operating systems, storage, or even individual application 30, 30'
capabilities, with the possible exception of limited user-specific
application configuration settings.
2. Cloud Computing Infrastructure 66 for a 2D to 3D data modeling
conversion Service (CCI 68). The capability provided to the user is to
provision processing, storage and retrieval, networks 18, 72, 74, 76, 78
and other fundamental computing resources where the consumer is able to
deploy and run arbitrary software, which can include operating systems
and applications 30, 30'. The user does not manage or control the
underlying cloud infrastructure 66 but has control over operating systems,
storage, deployed applications, and possibly limited control of select
networking components (e.g., host firewalls, etc.).
3. Cloud Computing Platform 70 for the a 2D to 3D data modeling
conversion Service (CCP 71). The capability provided to the user to
deploy onto the cloud infrastructure 66 created or acquired applications
created using programming languages and tools supported servers 20,
22, 24, 26, etc . . .
The user not manage or control the underlying cloud infrastructure 66
including network, servers, operating systems, or storage, but has control
over the deployed applications 30, 30' and possibly application hosting
environment configurations.

Exemplary cloud computing deployment models appear in Table 3. However, the present invention is not limited to these deployment models and more, fewer or other deployment models can also be used to practice the invention.

TABLE 3

1. Private cloud network 72. The cloud network infrastructure is operated
solely for 2D to 3D data modeling conversion. It may be managed by the
electronic content retrieval or a third party and may exist on premise or
off
premise.
2. Community cloud network 74. The cloud network infrastructure is
shared by several different organizations and supports a specific electronic
content storage and retrieval community that has shared concerns (e.g.,
mission, security requirements, policy, compliance considerations, etc.). It
may be managed by the different organizations or a third party and may
exist on premise or off premise.
3. Public cloud network 76. The cloud network infrastructure such as the
Internet, PSTN, SATV, CATV, Internet TV, etc. is made available to the
general public or a large industry group and is owned by one or more
organizations selling cloud services.
4. Hybrid cloud network 78. The cloud network infrastructure 66 is a
composition of two and/or more cloud networks 18 (e.g., private 72,
community 74, and/or public 76, etc.) and/or other types of public and/or
private networks (e.g., intranets, etc.) that remain unique entities but are
bound together by standardized or proprietary technology that enables
data and application portability (e.g., cloud bursting for load-balancing
between clouds, etc.)

Cloud software 64 for electronic content retrieval takes full advantage of the cloud paradigm by being service oriented with a focus on statelessness, low coupling, modularity, and semantic interoperability for electronic content retrieval. However, cloud software services 64 can include various states.

Cloud storage of desired electronic content on a cloud computing network includes agility, scalability, elasticity and multi-tenancy. Although a storage foundation may be comprised of block storage or file storage such as that exists on conventional networks, cloud storage is typically exposed to requesters of desired electronic content as cloud objects.

In one exemplary embodiment, the cloud application 30', offers cloud services for 2D to 3D data modeling conversion. The application 30, 30' offers the cloud computing Infrastructure 66, 68 as a Service 62 (IaaS), including a cloud software infrastructure service 62, the cloud Platform 70, 71 as a Service 62 (PaaS) including a cloud software platform service 62 and/or offers Specific cloud software services as a Service 62 (SaaS) including a specific cloud software service 62 for 2D to 3D data modeling conversion. The IaaS, PaaS and SaaS include one or more of cloud services 62 comprising networking, storage, server network device, virtualization, operating system, middleware, run-time, data and/or application services, or plural combinations thereof, on the cloud communications network 18.

Figure 5:
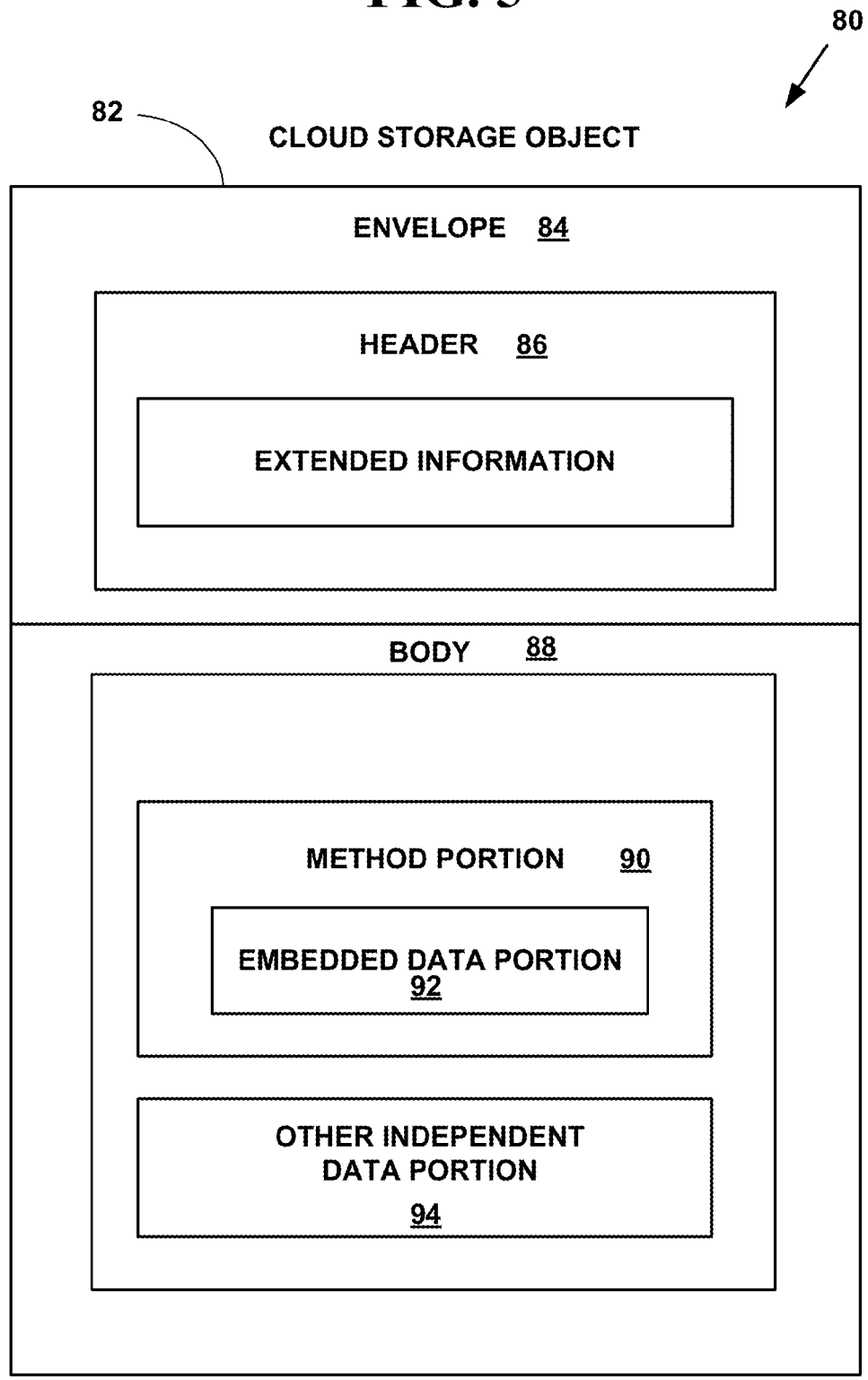
FIG. 5 is a block diagram illustrating an exemplary cloud storage object.

FIG. 5 is a block diagram 80 illustrating an exemplary cloud storage object 82.

The cloud storage object 82 includes an envelope portion 84, with a header portion 86, and a body portion 88. However, the present invention is not limited to such a cloud storage object 82 and other cloud storage objects and other cloud storage objects with more, fewer or other portions can also be used to practice the invention.

The envelope portion 84 uses unique namespace Uniform Resource Identifiers (URIs) and/or Uniform Resource Names (URNs), and/or Uniform Resource Locators (URLs) unique across the cloud communications network 18 to uniquely specify, location and version information and encoding rules used by the cloud storage object 82 across the whole cloud communications network 18. For more information, see IETF RFC-3305, Uniform Resource Identifiers (URIs), URLs, and Uniform Resource Names (URNs), the contents of which are incorporated by reference.

The envelope portion 84 of the cloud storage object 82 is followed by a header portion 86. The header portion 86 includes extended information about the cloud storage objects such as authorization and/or transaction information, etc.

The body portion 88 includes methods 90 (i.e., a sequence of instructions, etc.) for using embedded application-specific data in data elements 92. The body portion 88 typically includes only one portion of plural portions of application-specific data 92 and independent data 94 so the cloud storage object 82 can provide distributed, redundant fault tolerant, security and privacy features described herein.

Cloud storage objects 82 have proven experimentally to be a highly scalable, available and reliable layer of abstraction that also minimizes the limitations of common file systems. Cloud storage objects 82 also provide low latency and low storage and transmission costs.

Cloud storage objects 82 are comprised of many distributed resources, but function as a single storage object, are highly fault tolerant through redundancy and provide distribution of desired electronic content across public communication networks 76, and one or more private networks 72, community networks 74 and hybrid networks 78 of the cloud communications network 18. Cloud storage objects 82 are also highly durable because of creation of copies of portions of desired electronic content across such networks 72, 74, 76, 78 of the cloud communications network 18. Cloud storage objects 82 includes one or more portions of desired electronic content and can be stored on any of the 72, 74, 76, 78 networks of the cloud communications network 18. Cloud storage objects 82 are transparent to a requester of desired electronic content and are managed by cloud applications 30, 30'.

In one embodiment, cloud storage objects 82 are configurable arbitrary objects with a size up to hundreds of terabytes, each accompanied by with a few kilobytes of metadata. Cloud objects are organized into and identified by a unique identifier unique across the whole cloud communications network 18. However, the present invention is not limited to the cloud storage objects described, and more fewer and other types of cloud storage objects can be used to practice the invention.

Cloud storage objects 82 present a single unified namespace or object-space and manages desired electronic content by user or administrator-defined policies storage and retrieval policies. Cloud storage objects includes Representational state transfer (REST), Simple Object Access Protocol (SOAP), Lightweight Directory Access Protocol (LDAP) and/or Application Programming Interface (API) objects and/or other types of cloud storage objects. However, the present invention is not limited to the cloud storage objects described, and more fewer and other types of cloud storage objects can be used to practice the invention.

REST is a protocol specification that characterizes and constrains macro-interactions storage objects of the four components of a cloud communications network 18, namely origin servers, gateways, proxies and clients, without imposing limitations on the individual participants.

SOAP is a protocol specification for exchanging structured information in the implementation of cloud services with storage objects. SOAP has at least three major characteristics: (1) Extensibility (including security/encryption, routing, etc.); (2) Neutrality (SOAP can be used over any transport protocol such as HTTP, SMTP or even TCP, etc.), and (3) Independence (SOAP allows for almost any programming model to be used, etc.)

LDAP is a software protocol for enabling storage and retrieval of electronic content and other resources such as files and devices on the cloud communications network 18. LDAP is a "lightweight" version of Directory Access Protocol (DAP), which is part of X.500, a standard for directory services in a network. LDAP may be used with X.509 security and other security methods for secure storage and retrieval. X.509 is public key digital certificate standard developed as part of the X.500 directory specification. X.509 is used for secure management and distribution of digitally signed certificates across networks.

An API is a particular set of rules and specifications that software programs can follow to communicate with each other. It serves as an interface between different software programs and facilitates their interaction.

Bar Codes

A "barcode" is an optical machine-readable representation of data, which shows data about the object to which it attaches. Originally, barcodes represented data by varying the widths and spacing of parallel lines, and may be referred to as linear or 1 dimensional (1D). Later they evolved into rectangles, dots, hexagons and other geometric patterns in 2 dimensions (2D). Although 2D systems use a variety of symbols, they are generally referred to as barcodes as well. Barcodes originally were scanned by special—optical scanners called barcode readers, scanners and interpretive software are available on devices including desktop printers (not illustrated) and smart phones 14 and tablet computers 12.

Table 4 illustrates exemplary linear barcodes, the standards of all of which are incorporated by reference. However, the present invention is not limited to the exemplary linear barcodes listed in Table 4, and more fewer and other linear barcodes can also be used to practice the invention.

TABLE 4

Linear Bar Codes

U.P.C.
Codabar
Code 25 - Non-interleaved 2 of 5
Code 25 - Interleaved 2 of 5
Code 39
Code 93
Code 128
Code 128A
Code 128B
Code 128C
Code 11
CPC Binary
DUN 14
EAN 2
EAN 5
EAN 8, EAN 13
Facing Identification Mark
GS1-128 (formerly known as UCC/EAN-128), incorrectly referenced as EAN 128 and UCC 128
GS1 DataBar, formerly Reduced Space Symbology (RSS)
HIBC (HIBCC Health Industry Bar Code)
ITF-14
Latent image barcode
Pharmacode
Plessey
PLANET
POSTNET
Intelligent Mail barcode
MSI
PostBar
RM4SCC/KIX
JAN
Telepen Table 5 illustrates exemplary matrix (2D) barcodes, the standards of all of which are incorporated by reference. However, the present invention is not limited to the exemplary matrix barcodes listed in Table 5, and additional and other matrix barcodes can also be used to practice the invention.

TABLE 5

Matrix Bar Codes

3-DI
ArrayTag
Aztec Code
Small Aztec Code
Chromatic Alphabet
Codablock
Code 1
Code 16K
Code 49
ColorCode
Compact Matrix Code
CP Code
CyberCode
d-touch
DataGlyphs
Datamatrix
Datastrip Code
Dot Code A
EZcode
Grid Matrix Code TABLE 5-continued Matrix Bar Codes High Capacity Color Barcode
HueCode
INTACTA.CODE
InterCode
JAGTAG
Lorem ipsum
MaxiCode
mCode
MiniCode
MicroPDF417
MMCC
Nintendo e-Reader#Dot code
Optar
PaperDisk
PDF417
PDMark
QR Code
QuickMark Code
SmartCode
Snowflake Code
ShotCode
SPARQCode
SuperCod
Trillcode
UltraCode
UnisCode
VeriCode, VSCode
WaterCode In one specific embodiment, the application 30, 30' interacts with a bar code reader application for 2D to 3D data modeling conversion. However, the present invention is not limited to a bar code reader application and other applications can also be used to practice the invention.

Figure 6:
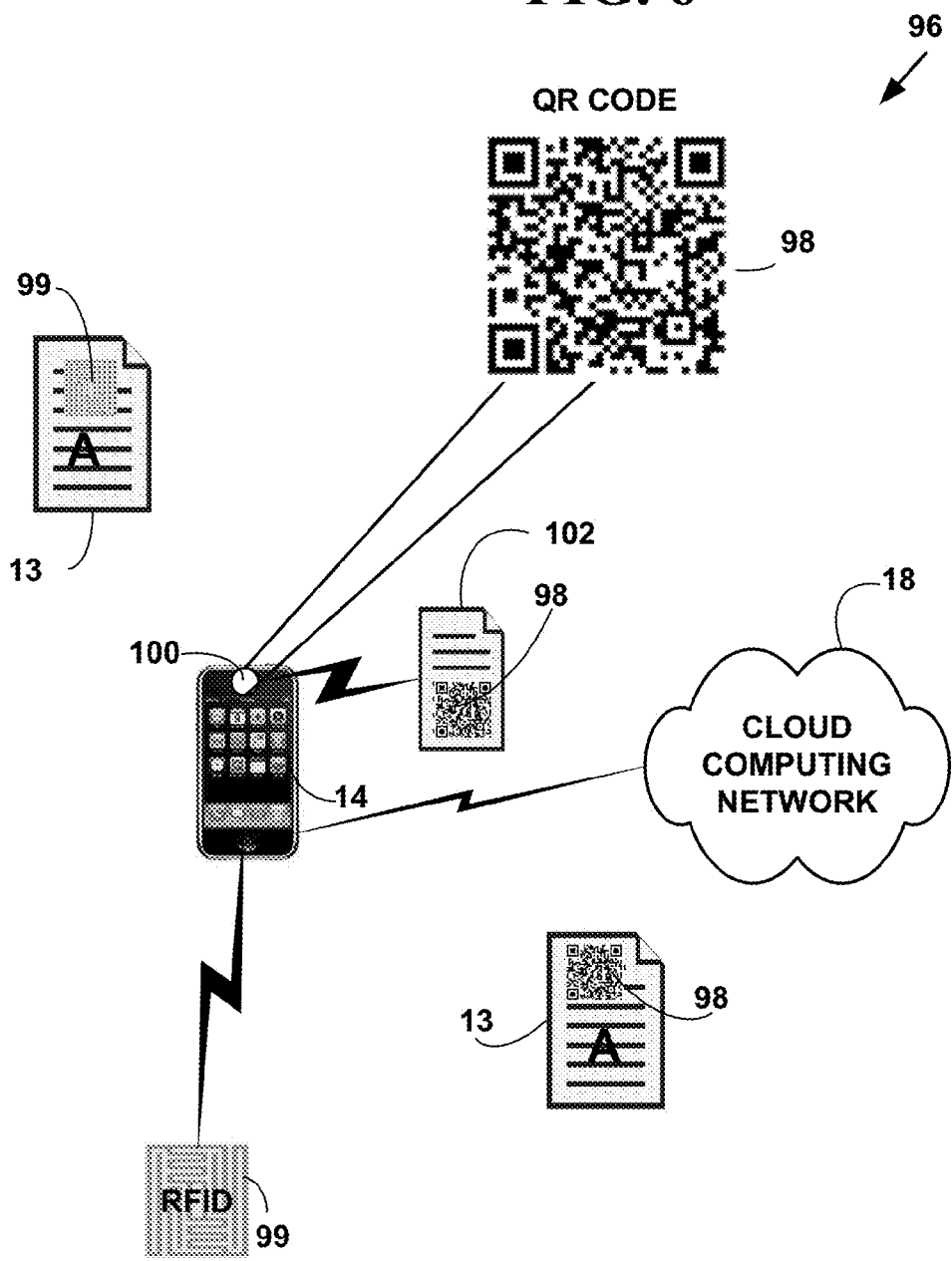
FIG. 6 is a block diagram illustrating an exemplary QR bar code.

In one specific exemplary embodiment, a QR bar code is used for 2D to 3D data modeling conversion. However, the present invention is not limited to QR codes and other types of bar codes can also be used to practice the invention FIG. 6 is a block diagram 96 illustrating display of an exemplary QR bar code 98. The QR bar code 98 in FIG. 6 is a valid QR bar code generated and including the text "This is a QR for a blue window 60 inches by 30 inches."

A "QR Code" is a specific matrix barcode (or two-dimensional code), readable by dedicated QR barcode readers and camera phones. The code consists of black modules arranged in a square pattern on a white background. The information encoded can be text, URL or other data. QR codes are defined in ISO/IEC 18004:2006 Information technology—Automatic identification and data capture techniques—QR Code 2005 bar code symbology specification, 1 Sep. 2006, the contents of which are incorporated by reference.

Users with a camera equipped smart phone 14 (or tablet computer 12, etc.) with a the camera component 100, a bar code reader application appropriate for the bar code processes the digital image of the QR Code can include the QR Code 98. The camera component 100 is used to capture existing QR codes from print and electronic documents 102 and other sources (e.g., from other network devices, etc.)

QR codes 98 are also used to display text, contact information, connect to a wireless network, open a web page in the phone's browser, download music, communicate a social event or coupon, or initiate a communications event over the cloud communications network 18 (e.g., voice call, data call, etc.) This act of linking from physical world objects is known as a "hardlink" or "physical world hyperlinks."

For example, Google's smart phone Android operating system supports the use of QR codes by natively including the barcode scanner (e.g., Zxing, etc.) on some models, and the browser supports Uniform Resource Identifier (URI) redirection, which allows QR Codes to send metadata to existing applications on the device. Nokia's Symbian operating system is also provided with a barcode scanner, which is able to read QR codes, while mbarcode is a QR code reader for the Maemo operating system. In the Apple iOS, a QR code reader is not natively included, but hundreds of free applications available with reader and metadata browser URI redirection capability. However, the present invention is not limited to these network device operating systems and other bar code readers and device operating systems can also be used to practice the invention.

In one embodiment, a user may scan a number of QR bar codes 98 from non-electronic information such as magazines, business cards, billboards, other non-electronic advertising, etc. A user may also scan a number of QR bar codes 98 from electronic advertising such from web-sites, other target network devices 12, 14, 16, from e-mails, text messages, instant messages, etc.

Wearable Devices

Wearable technology" and/or "wearable devices" are clothing and accessories incorporating computer and advanced electronic technologies. Wearable network devices provide several advantages including, but not limited to: (1) Quicker access to notifications. Important and/or summary notifications are sent to alert a user to view the whole message. (2) Heads-up information. Digital eye wear allows users to display relevant information like directions without having to constantly glance down; (3) Always-on Searches. Wearable devices provide always-on, hands-free searches; and (4) Recorded data and feedback. Wearable devices take telemetric data recordings and providing useful feedback for users for exercise, health, fitness, etc. activities.

Figure 7:
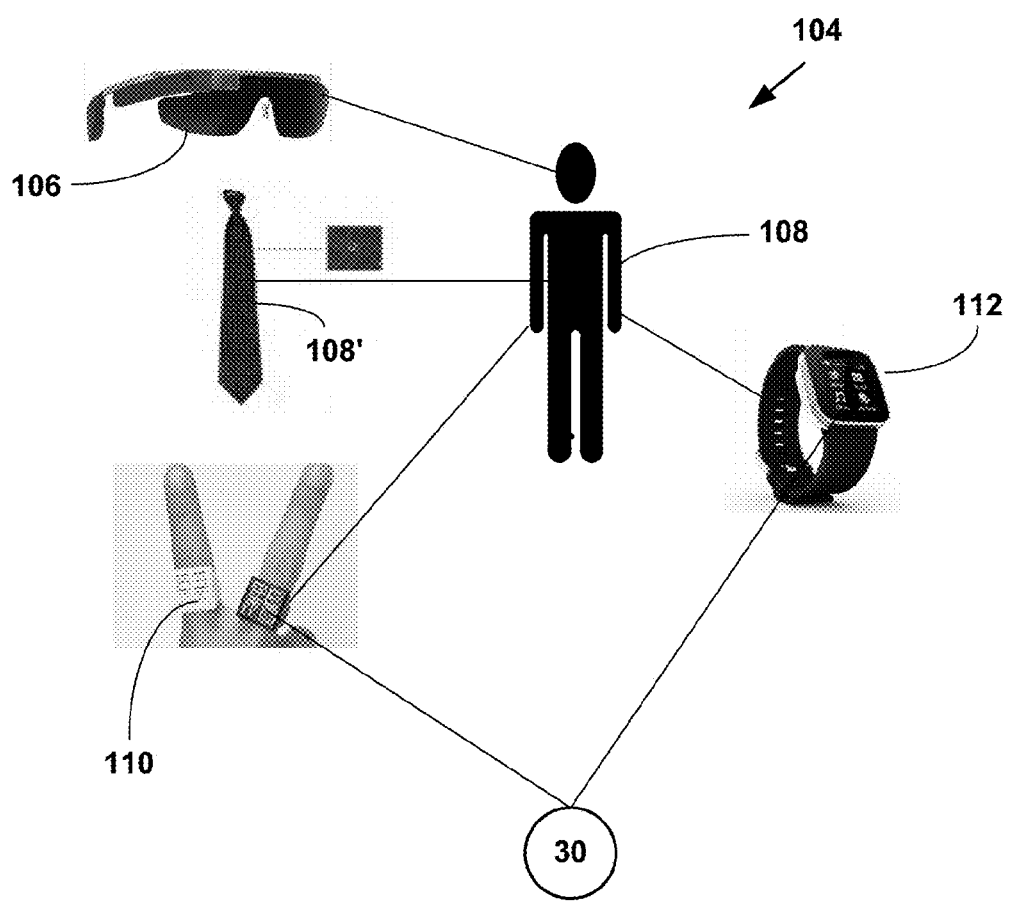
FIG. 7 is a block diagram illustrating wearable devices.

FIG. 7 is a block diagram with 104 illustrating wearable devices. The wearable devices include one or more processors and include, but are not limited to, wearable digital glasses 106, clothing 108 (e.g., smart ties 108', etc.), jewelry 110 (e.g., smart rings, smart earrings, etc.) and/or watches 112. The wearable devices are also wearable by animals (e.g., service dogs, pets, show animals, circus animals, etc.). However, the present invention is not limited to such embodiments and more, fewer and other types of wearable devices can also be used to practice the invention.

In one specific embodiment, the application 30, 30' interacts with wearable devices 106-112 for 2D to 3D data modeling conversion with Methods 114 and/or 136, etc. However, the present invention is not limited to a bar code reader application and other applications can also be used to practice the invention.

Creating Three Dimensional (3D) Objects from Two Dimensional (2D) Data for Building Information Modeling (BIM)

Figure 8B:
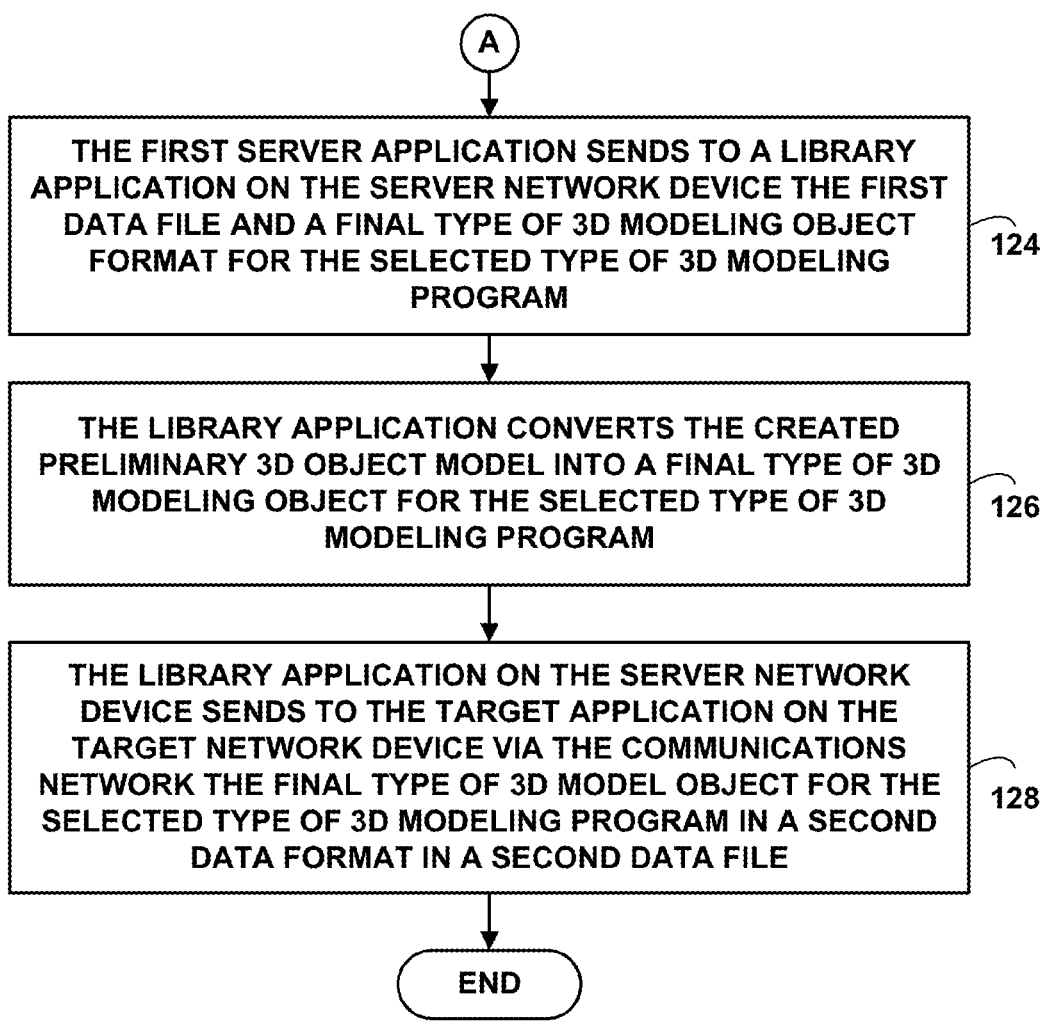

FIGS. 8A and 8B are a flow diagram illustrating a Method 114 for creating three dimensional (3D) objects from two dimensional (2D) data. In FIG. 8A at Step 116, a first server application on a first server network device with one or more processors receives two-dimensional (2D) electronic data for a specific type of three-dimensional (3D) modeling object for a selected type of 3D modeling program on a target application on target network device with one or more processors via a communications network. At Step 118, the first server application selects a blank generic 3D object model template for the specific type of 3D modeling object included in received 2D electronic data. At Step 120, the first server application creates a preliminary specific 3D object model in the selected blank generic 3D object model template in a selected mark-up language with the received 2D electronic data. At Step 122, the first server application converts the created preliminary 3D object model in the selected mark-up language to a first data format in a first data file. At Step 124, the first server application sends to a library application on the server network device the first data file and a final type of 3D modeling object format for the selected type of 3D modeling program. At Step 126, the library application converts the created preliminary 3D object model into a final type of 3D modeling object for the selected type of 3D modeling program. At Step 128, the library application on the server network device sends to the target application on the target network device via the communications network the final type of 3D model object for the selected type of 3D modeling program in a second data format in a second data file.

Method 114 is illustrated with an exemplary embodiment. However, the present invention is not limited to the exemplary embodiment, and other embodiments can also be used to practice the invention.

In such an exemplary embodiment in FIG. 8A at Step 116, a first server application 30' on a first server network device 24 with one or more processors receives two-dimensional (2D) electronic data 13, 15 for a specific type of three-dimensional (3D) modeling object for a selected type of 3D modeling program on a target application 30 on target network device 12, 14, 16 with one or more processors via a communications network 18.

In one embodiment, the two-dimensional (2D) electronic data includes Hyper Text Markup Language (HTML) data and/or QR bar code 98 data and/or RFID tag 99 data (FIG. 6). In another embodiment, the 2D electronic data may include an object specification file such as PDF file, text file or other file for any product from any manufacturer. In another embodiment the 2D electronic data includes information for new and/or non-existing products that may be produced or manufactured. In another embodiment the 2D electronic data virtual products that will only be used in a simulation model. In another embodiment, the 2D electronic data may include product information from a web-page on an e-commerce site, etc. However, the present invention is not limited to such and embodiment and other types of 2D electronic data can be used to practice the invention.

In one embodiment the selected type of 3D modeling program includes a Building Information Modeling (BIM) modeling program. In one specific embodiment, the BIM modeling program includes an AUTODESK REVIT program and/or an AUTOCAD and/or a VECTORWORKS program. However, the present invention is not limited to such an embodiment and other 3D modeling programs can be used to practice the invention.

At Step 118, the first server application 30' selects a blank generic 3D object model template for the specific type of 3D modeling object included in received 2D electronic data 13, 15.

In one embodiment, the blank generic 3D object model template is a template for a specific type of 3D modeling object used by architects, builders, engineers, interior designer, scientists, etc. For examples, the generic 3D object template used by an architect, builder, etc. may be a for door, window, beam, truss, etc. The specific type of 3D object may be a pre-hung door eight feet high, three feet wide, solid core, made of maple wood, stained light brown in color, etc. The generic type of 3D object templates used by engineers may be pipeline components, components of automobiles, trucks, boats, electronic device components, components for multi-layered boards, etc. The generic type of 3D object templates used by interior designers may be furniture, wall hangings, works of art, statutes, etc. However, the present invention is not limited to such embodiments and other blank generic 3D object templates can be used to practice the invention.

In one embodiment, the blank generic 3D object templates are used to dynamically create a final specific type of 3D object. This offers several advantages over the prior art in which hundreds to thousands of final specific types of 3D objects are created and stored in libraries. For example, if a user desired a 3D model of a pre-hung door eight feet high, three feet wide, solid core, made of maple wood, stained light brown in color, such a 3D model could be created. If the dimensions or the stain color, etc. of the door were changed, additional 3D models would be created and stored in the library.

In direct contrast, in the present invention, since blank generic 3D object templates are used, anytime received 2D electronic data is changed, a new final specific type of 3D object is dynamically generated and used. Such an embodiment only requires a small number (e.g., about 50-60, etc.) blank generic 3D object templates (e.g., door, window, beam, desk, chair, etc.). Such an embodiment requires less data storage, requires less processing power and an provides ultimate flexibility as a new final specific type of 3D object can be generated for virtually any type of 2D electronic data.

In one embodiment, the new final specific type of 3D object models created from the blank generic 3D object templates can be stored in a database or other non-volatile storage for re-use. In one embodiment, such new final specific type of 3D object models required less storage space than other types of native 3D object models used for the specific type of modeling program. However, the present invention is not limited to such embodiments and other embodiments that do not store the new final specific type of 3D object models can be used to practice the invention.

In one embodiment, the 2D electronic information further includes physical location information including, but not limited to, Global Positioning System (GPS) information, street address information, two-dimensional (2D) geo-space (e.g., X, Y) (e.g., building, floor), three-dimensional (3D) (X, Y, Z) (e.g., building, floor, floor location (e.g., room, office, desk, etc.)) or other physical location information (e.g., longitude, latitude, street address, etc.). However, the present invention is not limited to such physical location information and other physical location information can be used to practice the invention.

The Global Positioning System (GPS) is a space-based global navigation satellite system (GNSS) that provides reliable location and time information in all weather and at all times and anywhere on or near the Earth. A GPS receiver calculates its position by precisely timing signals sent by GPS satellites. A GPS receiver uses the messages it receives to determine a transit time of each message and computes a distance to each GPS satellite. These distances along with the satellites' locations are used with the possible aid of triangulation, depending on which algorithm is used, to compute a current physical position of the GPS receiver. This position is then displayed, perhaps with a moving map display (e.g., at a street level, etc.) and/or latitude and longitude and/or elevation and/or speed and/or acceleration information may also be included. Many GPS units also show derived information such as travel direction and speed, calculated from position changes. The GPS coordinates include standard GPS, GPS map, Digital GPS (DGPS) and/or other types of GPS information.

Returning to FIG. 8A at Step 120, the first server application 30' creates a preliminary specific 3D object model in the selected blank generic 3D object template in a selected mark-up language with the received 2D electronic data. In one exemplary embodiment, the XML mark-up language is used. However, the present invention is not limited to such an embodiment and other mark-up and/or other non-mark-up languages can be used to practice the invention. In such an embodiment, XML is used to create an XML schema that specifically layouts the received 2D electronic data into a specific data format that is used by the library application.

An "XML schema" is a description of a type of XML document, typically expressed in terms of constraints on the structure and content of documents of that type, above and beyond the basic syntactical constraints imposed by XML itself. These constraints are generally expressed using some combination of grammatical rules governing the order of elements, Boolean predicates that the content must satisfy, data types governing the content of elements and attributes, and more specialized rules such as uniqueness and referential integrity constraints.

There are languages developed specifically to express XML schemas. The Document Type Definition (DTD) language, which is native to the XML specification, is a schema language that is of relatively limited capability, but that also has other uses in XML aside from the expression of schemas.

At Step 122, the first server application 30' converts the created preliminary 3D object in the XML schema to a text data format in a data file with a .TXT extension. A text file is a kind of data file that is structured as a sequence of lines of electronic text. A text file exists within a file system on a network device. "Text file" refers to a type of container, while "plain text" refers to a type of content. Text files can contain plain text, but they are not limited to such. At a generic level of description, there are two kinds of computer files: text files and binary files.

Text files are used to avoid some of the problems encountered with other file formats, such as endianness (i.e., byte ordering), padding bytes, or differences in the number of bytes in a machine word. Further, when data corruption occurs in a text file, it is often easier to recover and continue processing the remaining contents. When opened by a text editor, human-readable content is presented to the user with text.

In one embodiment, text files are used to allow the 3D models to be human-readable. However, the present invention is not limited to such embodiments and other types of human-readable and/or machine readable file formats and file types can be used to practice the invention. Such text files are also required by many 3D modeling programs (e.g., AUTODESK REVIT, AUTOCAD, VECTORWORKS, MICROSTATION, ARCHICAD, etc.).

In another embodiment, the At Step 122, the first server application 30' converts the created preliminary 3D object in the XML schema to a text data format in a data file with a .DOC, .RTF and/or .PDF extension.

A Document (DOC) file is created in a version of MICROSOFT WORD's processing application prior to MICROSOFT OFFICE. A .DOC files use a .DOC extension and differ from text files (.TXT extension) because they contain proprietary codes that must be opened in WORD or software that reads the WORD. format.

A Rich Text Format (RTF) file is standard formalized by MICROSOFT Corporation for specifying formatting of documents. RTF files are actually ASCII files with special commands to indicate formatting information, such as fonts and margins.

A Portable Document Format (PDF) is a file format standardized by ADOBE SYSTEMS that is used to represent documents in a manner independent of application software, hardware, and operating system. Each PDF file encapsulates a complete description of a fixed-layout flat document, including the text, fonts, graphics, and other information needed to display it.

However, the present invention is not limited to these embodiments and other files types, layouts and file extensions can be used to practice the invention.

In FIG. 8B at Step 124, the first server application 30' sends to a library application 31 on the server network device 24 the text file and a final type of 3D modeling object format for the selected type of 3D modeling program (e.g., AUTODESK REVIT, AUTOCAD, VECTORWORKS, MICROSTATION, ARCHICAD, etc.).

In one embodiment, the library application is a Dynamic Link Library (DLL) application. However, the present invention is not limited to such an embodiment and other types of library applications can be used to practice the invention.

A Dynamic-link library (DLL), is Microsoft's implementation of the shared library concept in the MICROSOFT WINDOWS and OS/2 operating systems. These libraries usually have the file extension .DLL, .OCX (for libraries containing ActiveX controls), or .DRV (for legacy system drivers). The file formats for DLLs are the same as for WINDOWS EXE files—that is, Portable Executable (PE) for 32-bit and 64-bit Windows, and New Executable (NE) for 16-bit WINDOWS. As with EXEs, DLLs can contain code, data, and resources, in any combination.

Data files with the same file format as a DLL, but with different file extensions and possibly containing only resource sections, can be called resource DLLs. Examples of such DLLs include icon libraries, sometimes having the extension .ICL, and font files, having the extensions .FON and .FOT.

In another embodiment, the library application 31 includes Dynamic Library Loading (DLL). This is a mechanism by which a computer program can, at run time, dynamically load a library (or other binary) into memory, retrieve the addresses of functions and variables contained in the library, execute those functions or access those variables, and unload the library from memory. Unlike static linking and loadtime linking, this mechanism allows a computer program to startup in the absence of these libraries, to discover available libraries, and to potentially gain additional functionality. However, the present invention is not limited to such an embodiment and other types of library applications can be used to practice the invention.

At Step 126, library application 31 converts the created preliminary 3D object model into a final type of 3D modeling object 13', 15' for the selected type of 3D modeling program (e.g., AUTODESK REVIT, AUTOCAD, VECTORWORKS, MICROSTATION, ARCHICAD, etc.).

In one embodiment, it creates a four dimensional (4D) or higher dimensional modeling object. However, the present invention is not limited to this embodiment and other embodiments may be used to practice the invention.

A 4D BIM is a term widely used in the CAD industry, refers to the intelligent linking of individual 3D CAD components or assemblies with time or schedule-related information. The use of the term 4D is intended to refer to the fourth dimension: time (i.e., 4D is 3D+schedule (time)).

The construction of the 4D models enables the various participants (e.g., from architects, designers, contractors to owners) of a construction project, to visualize the entire duration of a series of events and display the progress of construction activities through the lifetime of the project. This BIM-centric approach towards project management technique has a very high potential to improve the project management and delivery of construction project, of any size or complexity.

A 5D BIM is also term widely used in the CAD industry, which refers to the intelligent linking of individual 3D CAD components or assemblies with schedule (time, 4D) constraint and cost-related information (5D). The use of the term 5D is intended to refer to the addition of 4D: time and 5D: cost to the 3D model (i.e., 5D is 3D+schedule (4D time)+cost).

The construction of the 5D models enables the various participants (e.g., from architects, designers, contractors to owners) of any construction project, to visualize the progress of construction activities and its related costs over time.

AUTODESK REVIT, is Building Information Modeling (BIM) software for architects, structural engineers, MEP engineers, designers and contractors. It allows users to design a building and structure and its components in 3D, annotate the model with 2D drafting elements and access building information from the building models database. REVIT is 4D BIM capable with tools to plan and track various stages in the building's lifecycle, from concept to construction and later demolition.

AUTOCAD is a software application for 2D and 3D computer-aided design (CAD) and drafting. It has been available since 1982 as a desktop application and since 2010 as a mobile web- and cloud-based application, currently marketed as AUTOCAD 360.

VECTORWORKS is a computer-aided design (CAD) and Building Information Modeling (BIM) software program developed by Nemetschek. VECTORWORKS that is used for drafting, technical drawing and 3D modeling. VECTORWORKS offers 2D, 3D, production management, and presentation capabilities for all phases of the design process.

MICROSTATION is a CAD software product for 2- and 3-dimensional design and drafting, developed and sold by BENTLEY SYSTEMS. The latest versions of the software are released solely for MICROSOFT WINDOWS operating systems, but historically MICROSTATION was available for APPLE MACINTOSH platforms and a number of UNIX-like operating systems. MICROSTATION is the platform architectural and engineering software package developed by BENTLEY SYSTEMS, Incorporated. Among a number of things, it generates 2D/3D vector graphic objects and elements.

ARCHICAD is an architectural BIM CAD software for APPLE MACINTOSH and Microsoft Windows developed by the Hungarian company GRAPHISOFT. ARCHICAD offers specialized solutions for handling all common aspects of aesthetics and engineering during the whole design process of the built environment—buildings, interiors, urban areas, etc.

Development of ARCHICAD started in 1982 for the original APPLE MACINTOSH. ARCHICAD is recognized as the first CAD product on a personal computer able to create both 2D drawings and parametric 3D geometry.[1] In its debut in 1987 ARCHICAD also became the first implementation of BIM under GRAPHISOFT's "Virtual Building" concept.

SOLIDWORKS is a 3D mechanical CAD program that runs on MICROSOFT WINDOWS and is developed by DASSAULT SYSTÈMES SOLIDWORKS CORP., a subsidiary of DASSAULT SYSTEMES, S. A. (Vélizy, France).

TC CREO, formerly known as PRO/ENGINEER or PRO/E is a parametric, integrated 3D CAD/CAM/CAE solution created by PARAMETRIC TECHNOLOGY CORPORATION (PTC). It was the first to market with parametric, feature-based, associative solid modeling software. The application runs on MICROSOFT WINDOWS platform, and provides solid modeling, assembly modeling and drafting, finite element analysis, Direct and Parametric modeling, Sub-divisional and nurbs surfacing and NC and tooling functionality for mechanical engineers.

At Step 128, library application 31 on the server network device 24 sends to the target application 30 on the target network device 12, 14, 16 via the communications network 18 the final type of 3D model object 13', 15' for the selected type of 3D modeling program (e.g., AUTODESK REVIT, AUTOCAD, VECTORWORKS etc.) in a second data format in a second data file.

In such an embodiment, the second data format and the second data files include an AUTODESK REVIT 3D modeling object in an AUTODESK REVIT formatted file with a .RFA file extension and/or .RVT file extension and/or an AUTOCAD 3D modeling object in an AUTOCAD formatted file with a .DWG file extension.

In another embodiment, the second data format and the second data files include files used by VECTORWORKS, MICROSTATION, ARCHICAD, SOLIDWORKS and PROE programs.

In another embodiment, the second data format and the second data files includes text and document files with a .TXT, .DOC, .RTF and/or a .PDF extensions. Such second data files may also include product data sheets and other types of informational files.

However, the present invention is not limited to such embodiments and other 3D/4D/5D modeling objects and file formats can be used to practice the invention.

An AUTODESK REVIT Family File is stored in an RFA format and is affixed with a .RFA extension. These RFA files are generally classified as data files that include one or more 3D models that can be imported into a three dimensional scene and were created and saved using the Revit Family Editor. RFA files contain BIM (Building Information Modeling) data and require Autodesk Revit software. These files are also known as an AUTODESK REVIT file. The AUTODESK REVIT software is used by architects and engineers to design and model. The REVIT model is based on a compilation of items called "families." The compiled items refer to the parametric objects such as 3D building objects and two dimensional drafting objects.

RVT file formatted files with a .RVT extension are data files primarily associated with VERSAPRO Reference View Table. RVT files are also associated with AUTODESK REVIT Design Setup File, INCITE Media Assistant File, IEX Workforce Management Report, APACHE RIVET Tcl File and FILEVIEWPRO.

DWG file formatted files (DraWinG) with a .DWG extension are a binary file format used for storing two and three dimensional design data and metadata. It is the native format for several CAD packages including DRAFTSIGHT, AUTOCAD, INTELLICAD (and its variants) and CADDIE. In addition, DWG is supported non-natively by many other CAD applications. The .BAK (drawing backup), .DWS (drawing standards), .DWT (drawing template) and .SV$ (temporary automatic save) files are also DWG files.

MCD and/or VWX formatted files with a .MCD and/or a .VWX extension are file formats used for storing two and three dimensional design data and metadata for VECTORWORKS.

In addition, using the present invention two or more companies will facilitate work process interoperability between their applications through supporting the reciprocal use of available Application Programming Interfaces (APIs) and the new 3D models created herein.

In one embodiment, the final type of 3D model object 13', 15' for the selected type of 3D modeling program is automatically installed in the target network device. In another embodiment, the final type of 3D model object 13', 15' for the selected type of 3D modeling program is manually installed on the target network device. However, the present invention is not limited to such embodiments, and other embodiments can be used to practice the invention.

In one embodiment at Step 128, the final type of 3D model object 13', 15' for the selected type of 3D modeling program is sent to another server network device (e.g., 22, etc.) via the communications network instead of back to the target network device 12, 14, 16. In such an embodiment a user may request a new 3D model of an object and the new 3D model may then be sent to and installed on a company system of the user to be used and re-used by other persons in the company. However, the present invention is not limited to such embodiments, and other embodiments can be used to practice the invention.

In one embodiment, Step 128 further includes sending the text file that was created at Step 124 as some existing 3D modeling programs can utilize the text file created. However, the present invention is not limited to such embodiments, and other embodiments can be used to practice the invention.

In another embodiment, Step 128 further includes sending additional text files, .DOC files, .RTF files and/or .PDF files specifically created to include additional 3D or higher dimensional modeling information and/or product and/or project information. However, the present invention is not limited to such embodiments, and other embodiments can be used to practice the invention.

In one embodiment, Method 114 is used to model every item used in building a structure or vehicle from the fasteners (e.g., nails, screws, bolts, etc.) to the paint, to the structural components etc.

In one embodiment, Method 114 is used to provide seamless extensions and additions to existing 3D modeling programs (e.g., AUTODESK REVIT, AUTOCAD, etc.) that are very useful to users of such programs.

In one embodiment, Method 114 is used to create new 2D and/or 3D and/or 4D and/or 5D model objects from received 2D data. In such an embodiment, the steps of Method 114 are practiced with blank generic 2D object model templates and/or blank generic 4D object model templates. In such embodiments, the final type of 2D and/or 4D and/or 5D model object for the selected type of 3D modeling program is returned to the target network device.

However, the present invention is not limited to 2D, 3D 4D and/or 5D model objects and higher dimension model objects can also be used to practice the invention.

However, the present invention is not limited to such embodiments, and other embodiments can be used to practice the invention.

Figure 9:
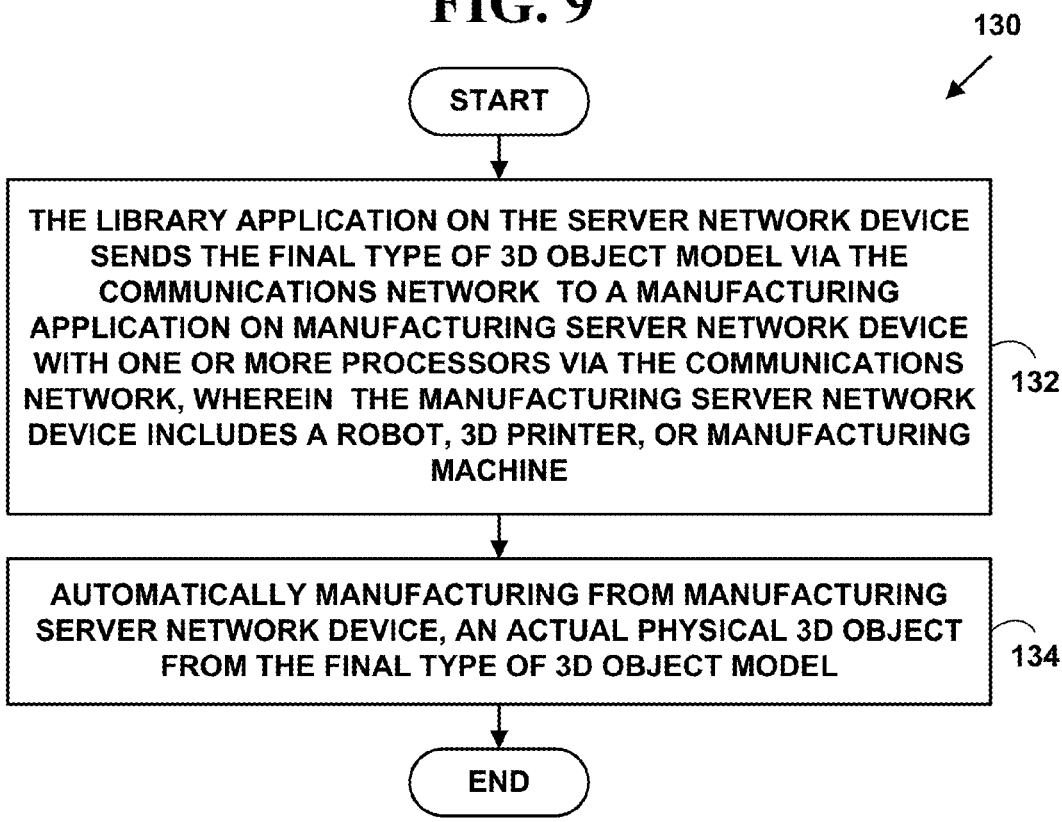
FIG. 9 is a flow diagram illustrating a method for creating three dimensional (3D) objects from two dimensional (2D) data.

In one exemplary embodiment, Method 114 further includes the steps illustrated in FIG. 9 130. However, the present invention is not limited to these additional steps and the invention can be practiced with and/or without the additional steps in FIG. 9.

FIG. 9 is a flow diagram illustrating a Method 130 for creating three dimensional (3D) objects from two dimensional (2D) data.

In FIG. 9 at Step 132, the library application 31 on the server network device 24 sends the final type of 3D object model 13' via the communications network 18 to a manufacturing application 33 on manufacturing server network device 26 with one or more processors via the communications network 18. The manufacturing server network device includes a robot 41, 3D printer 37, or manufacturing machine 35. At Step 134, automatically manufacturing from manufacturing server network device 26, an actual physical 3D object 37 (e.g., door 39, FIG. 1, etc.) from the final type of 3D object model 13', 15'.\

Creating Three Dimensional (3D) Objects from Two Dimensional (2D) Data for Building Information Modeling (BIM) with Cloud Computing The present invention also provides the creation of 3D modeling objects 13,' 15' on a cloud communications network 18.

Figure 10A:
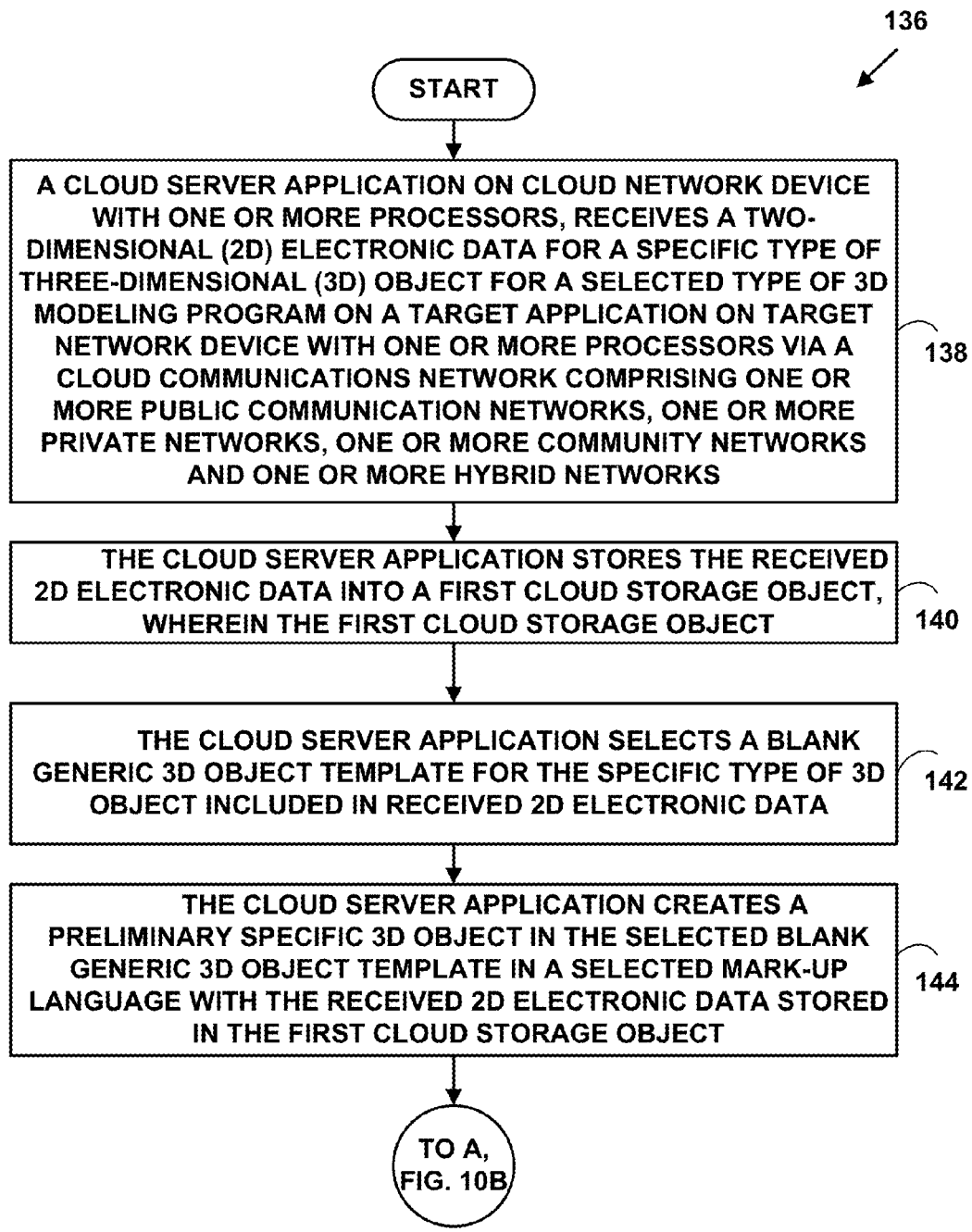
FIGS. 10A and 10B are a flow diagram illustrating a method for creating three dimensional (3D) objects from two dimensional (2D) data with cloud computing.
Figure 10B:
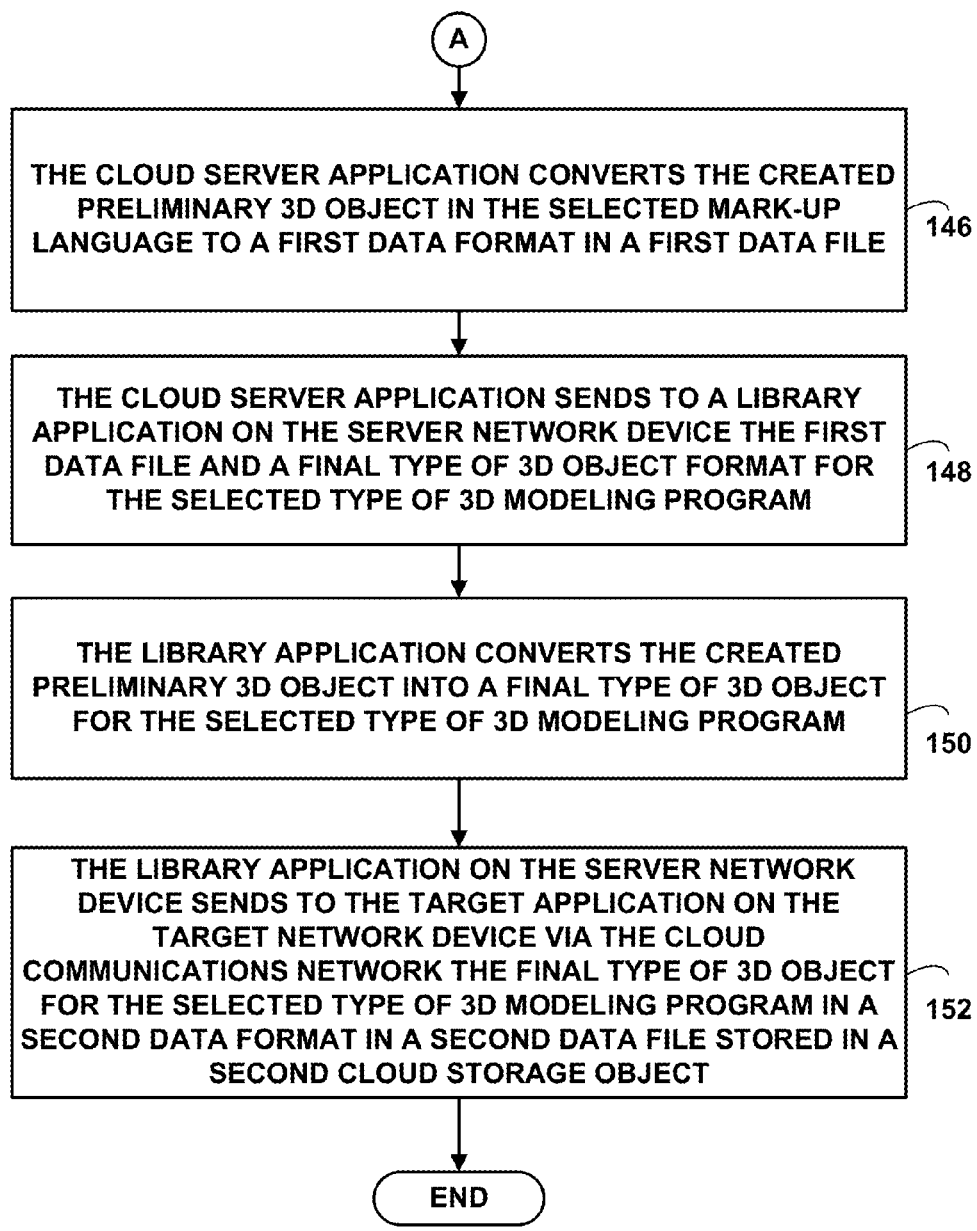

FIGS. 10A and 10B are a flow diagram illustrating a Method 136 creating three dimensional (3D) objects from two dimensional (2D) data with cloud computing. In FIG. 10A at Step 138, a cloud server application on cloud network device with one or more processors receives two-dimensional (2D) electronic data for a specific type of three-dimensional (3D) object for a selected type of 3D modeling program on a target application on target network device with one or more processors via a cloud communications network comprising one or more public communication networks, one or more private networks, one or more community networks and one or more hybrid networks. At Step 140, the cloud server application stores the received 2D electronic data into a first cloud storage object. At Step 142, the cloud server application selects a blank generic 3D object template for the specific type of 3D object included in received 2D electronic data. At Step 144, the cloud server application creates a preliminary specific 3D object in the selected blank generic 3D object template in a selected mark-up language with the received 2D electronic data stored in the first cloud storage object. In FIG. 10B at Step 146, the cloud server application converts the created preliminary 3D object in the selected mark-up language to a first data format in a first data file. At Step 148, the cloud server application sends to a library application on the server network device the first data file and a final type of 3D object format for the selected type of 3D modeling program. At Step 150, the library application converts the created preliminary 3D object into a final type of 3D object for the selected type of 3D modeling program. At Step 152, the library application on the server network device sends to the target application on the target network device via the cloud communications network the final type of 3D object for the selected type of 3D modeling program in a second data format in a second data file stored in a second cloud storage object.

Method 136 is illustrated with an exemplary embodiment. However, the present invention is not limited to the exemplary embodiment, and other embodiments can also be used to practice the invention.

In such an exemplary embodiment in FIG. 10A at Step 138, a cloud server application 30' on cloud network device 24 with one or more processors, receives two-dimensional (2D) electronic data 13, 15 for a specific type of three-dimensional (3D) object for a selected type of 3D modeling program from a target application 30 on target network device 12, 14, 16 with one or more processors via a cloud communications 18 network comprising one or more public communication networks 76, one or more private networks 72, one or more community networks 74 and one or more hybrid networks 78.

At Step 140, the cloud server application 30' stores the received 2D electronic data into a first cloud storage object 82.

At Step 142, the cloud server application 30' selects a blank generic 3D object template for the specific type of 3D object included in received 2D electronic data.

At Step 144, the cloud server application 30' creates a preliminary specific 3D object in the selected blank generic 3D object template in a selected mark-up language (e.g., XML, etc.) with the received 2D electronic data stored in the first cloud storage object 82.

FIG. 10B at Step 146, the cloud server application 30' converts the created preliminary 3D object in the selected mark-up language to a first data format in a first data file (e.g., a text data file, etc.).

At Step 148, the cloud server application 30' sends to a library application 31 on the server network device 24 the first data file and a final type of 3D object format for the selected type of 3D modeling program.

At Step 150, the library application 31 converts the created preliminary 3D object into a final type of 3D modeling object 13', 15' for the selected type of 3D modeling program.

At Step 152, the library application 31 on the server network device 24 sends to the target application 30' on the target network device 12, 14, 16 via the cloud communications network 18 the final type of 3D object for the selected type of 3D modeling program in a second data format in a second data file stored in a second cloud storage object 82.

Figure 11:
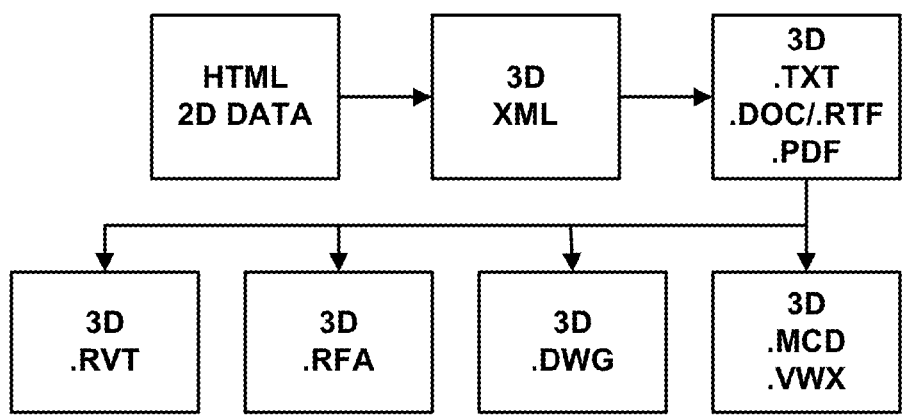
FIG. 11 is a block diagram illustrating a data flow for the method of FIG. 8.

FIG. 11 is a block diagram illustrating a data flow 154 for Method 114 of FIG. 8.

The methods and system described herein creates three dimensional (3D) models from two dimensional (2D) data for building information modeling (BIM) and for other types of modeling. The method and system allow new, 2D, 3D and higher dimensional models to be created for existing 3D modeling programs (e.g., AUTODESK REVIT, AUTOCAD, VECTORWORKS, MICROSTATION, ARCHICAD, etc.). The new models are used to enhance and extend existing 3D modeling programs. The new models can also be used to directly create physical objects (e.g., windows, doors, etc.) represented by the new models with robots, 3D printers and manufacturing machines.

It should be understood that the architecture, programs, processes, methods and It should be understood that the architecture, programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

While various elements of the preferred embodiments have been described as being implemented in software, in other embodiments hardware or firmware implementations may alternatively be used, and vice-versa.

The claims should not be read as limited to the described order or elements unless stated to that effect. In addition, use of the term "means" in any claim is intended to invoke 35 U.S.C. §112, paragraph 6, and any claim without the word "means" is not so intended.

Therefore, all embodiments that come within the scope and spirit of the following claims and equivalents thereto are claimed as the invention.

We claim:

1. A method for creating three-dimensional (3D) objects from two dimensional (2D) data, comprising:

receiving on a first server application on a first server network device with one or more processors, two-dimensional (2D) electronic data for a new specific type of three-dimensional (3D) object model for a selected type of 3D modeling program including a Building Information Modeling (BIM) 3D modeling program from a target application on target network device with one or more processors via a communications network, wherein the new specific type of three-dimensional (3D) object model did not previously exist as a native 3D object model in the BIM 3D modeling program;

selecting from the first server application a blank generic 3D object template for the new specific type of three-dimensional (3D) object model included in the received 2D electronic data;

creating on the first server application a preliminary specific 3D object model in the selected blank generic 3D object model template in a selected mark-up language with the received 2D electronic data;

converting on the first server application the created preliminary specific 3D object model in the selected mark-up language to a first data format in a first data file;

sending from the first server application to a library application on the first server network device the first data file and a final type of 3D object model format for the selected BIM 3D modeling program;

converting from the library application the created preliminary specific 3D object model and the final type of 3D object model format into a new final type of 3D object model for the selected BIM 3D modeling program, wherein the new final type of 3D object model requires less storage space than native 3D object models used within the selected BIM 3D modeling program;

sending from the library application on the first server network device to the target application on the target network device via the communications network the new final type of 3D object model including the final type of 3D object model format for the selected BIM 3D modeling program in a second data format in a second data file;

enhancing and extending the selected BIM 3D modeling program with the new final type of 3D object model by allowing the creation of the new final type of 3D object model and other new final types of 3D object models for specific products from specific product providers and for new products from the specific product providers or new product providers that did not originally exist in the selected BIM 3D modeling program and were not originally included in the selected BIM 3D modeling program; and further enhancing and extending the selected BIM 3D modeling program by allowing the library application on the first server network device to send via the communications network the new final type of 3D object model to a second server application on a second server network device with one or more processors to create an actual physical 3D object for a new product that did not previously exist and was not previously available from the specific product providers or the new product providers and is represented by the new final type of 3D object model.

2. The method of claim 1 wherein the two-dimensional (2D) electronic data includes Hyper Text Markup Language (HTML) data, QR bar code data or Radio Frequency IDentifier (RFID) data.

3. The method of claim 1 wherein the selected type of 3D modeling program further includes the Building Information Modeling (BIM) modeling program with four dimensional (4D) object models comprising 3D object models further including scheduling information and five dimensional (5D) object models comprising 4D object models further including cost information.

4. The method of claim 1 where the selected BIM modeling program includes an AUTODESK REVIT program, an AUTOCAD program, a VECTORWORKS, a MICROSTATION program, or an ARCHICAD program.

5. The method of claim 1 wherein the new final type of 3D object model includes an AUTODESK REVIT 3D modeling object, an AUTOCAD 3D modeling object, a VECTORWORKS 3D modeling object, a MICROSTATION 3D modeling object, or an ARCHICAD 3D modeling object.

6. The method of claim 1 wherein the selected markup language includes eXtensible Markup Language (XML) schema.

7. The method of claim 1 wherein the first data file format includes a text file format or a document file format and wherein the second data file format includes a 3D or higher dimensional modeling object file format, a text file format or a document file format.

8. The method of claim 1 wherein the library application includes a Dynamic Link Library (DLL) library application or a Dynamic Library Loading application.

9. The method of claim 1 wherein the sending from the library application step includes sending the second data file with the second data file format including an AUTODESK REVIT 3D modeling object in an AUTODESK REVIT formatted file with a .RFA file extension or a .RFT file extension or an AUTOCAD 3D modeling object in an AUTOCAD formatted file with a .DWG file extension.

10. The method of claim 1 wherein the first server network device and the target network device include a wireless networking interface comprising a IEEE 802.11a, 802.11b, 802.11g, 802.11n, 802.15.4, Wireless Fidelity (Wi-Fi), Worldwide Interoperability for Microwave Access (Wi-Max), Performance Radio Metropolitan Area Network (HIPERMAN), Infrared or Bluetooth wireless networking interface for communicating with the communications network.

11. The method of claim 1 where the first server network device and the target network device include a wireless network interface for Near Field Communications (NFC) or Machine-to-Machine (M2M) communications for communicating with the communications network.

12. The method of claim 1 wherein the target network device includes a desktop computer, laptop computer, tablet computer, mobile phone, non-mobile phone with display, smart phone, 3D printer, Internet phone, Internet appliance, personal digital/data assistants (PDA), digital camera, portable game console, non-portable game console, wearable network device, cable television (CATV) set-top box, satellite television (SATV) set-top box, Internet television set-top box and digital televisions including high definition televisions (HDTV) and three-dimensional (3DTV) televisions.

13. The method of claim 1 further comprising:
creating on the first server application a preliminary specific 2D object model in the selected mark-up language with the received 2D electronic data;
converting on the first server application in the selected mark-up language to the first data format in the first file;
sending from the first server application to the library application on the first server network device the first file and a final type of 2D object model format for the selected BIM 3D modeling program;
converting from the library application the created preliminary specific 2D object model into a final type of 2D object model for the selected BIM 3D modeling program; and
sending from the library application on the first server network device to the target application on the target network device via the communications network the final type of 2D object model for the selected BIM 3D modeling program.

14. The method of claim 1 wherein target application on the target network device or the library application on the first server network device sends the new final type of 3D object model for the selected BIM 3D modeling program to a manufacturing application on manufacturing server network device with one or more processors via the communications network to automatically manufacture the actual physical 3D object from the new final type of 3D object model for the new product that did not previously exist and was not previously available from the specific product providers or the new product providers.

15. The method of claim 14 wherein the manufacturing server network device includes a robot, 3D printer, or manufacturing machine.

16. The method of claim 1 further comprising:
receiving on a cloud server application on a cloud network device with one or more processors, the two-dimensional (2D) electronic data for the new specific type of three-dimensional (3D) object model for the selected BIM 3D modeling program from the target application on the target network device with one or more processors via a cloud communications network comprising two or more different communication networks;
storing from the cloud server application the received 2D electronic data into a first cloud storage object;
selecting from the cloud server application the blank generic 3D object model template for the new specific type of 3D object model included in the received 2D electronic data;
creating on the cloud server application the preliminary specific 3D object in the selected blank generic 3D object model template in the selected mark-up language with the received 2D electronic data stored in the first cloud storage object;
converting on the cloud server application the created preliminary specific 3D object model in the selected mark-up language to the first data format in the first data file;
sending from the cloud server application to the library application on the cloud server network device the first data file and the final type of 3D object format model for the selected BIM 3D modeling program;
converting from the library application the created preliminary specific 3D object model and the final type of 3D object model format into the new final type of 3D object model for the selected BIM 3D modeling program; and
sending from the library application on the cloud server network device to the target application on the target network device via the cloud communications network the final type of 3D object model for the selected BIM 3D modeling program in the second data format in the second data file.

17. The method of claim 16 wherein the cloud communications network includes an 2D to 3D data modeling conversion service, a cloud computing platform for a 2D to 3D data modeling conversion service and a cloud computing infrastructure for the a 2D to 3D data modeling conversion service and wherein the cloud communications network includes on-demand 2D to 3D data modeling conversion services, broadband network access, resource pooling, rapid elasticity and measured network services for 2D to 3D data modeling conversion services.

18. The method of claim 16 wherein the cloud server application offers a cloud computing Infrastructure as a Service (IaaS), a cloud Platform as a Service (PaaS) and offers a Specific cloud software service as a Service (SaaS) including a specific cloud software service for 2D to 3D data modeling conversion services.

19. A non-transitory computer readable medium having stored therein a plurality of instructions for causing one more processors on one more network devices connected to a communications network to execute the steps of:
receiving on a first server application on a first server network device with one or more processors, two-dimensional (2D) electronic data for a new specific type of three-dimensional (3D) object model for a selected type of 3D modeling program including a Building Information Modeling (BIM) 3D modeling program from a target application on target network device with one or more processors via a communications network, wherein the new specific type of three-dimensional (3D) object model did not previously exist as a native 3D object model in the BIM 3D modeling program;
selecting from the first server application a blank generic 3D object template for the new specific type of three-dimensional (3D) object model included in the received 2D electronic data;
creating on the first server application a preliminary specific 3D object model in the selected blank generic 3D object model template in a selected mark-up language with the received 2D electronic data;
converting on the first server application the created preliminary specific 3D object model in the selected mark-up language to a first data format in a first data file;
sending from the first server application to a library application on the first server network device the first data file and a final type of 3D object model format for the selected BIM 3D modeling program;

converting from the library application the created preliminary specific 3D object model and the final type of 3D object model format into a new final type of 3D object model for the selected BIM 3D modeling program, wherein the new final type of 3D object model requires less storage space than native 3D object models used within the selected BIM 3D modeling program;

sending from the library application on the first server network device to the target application on the target network device via the communications network the new final type of 3D object model including the final type of 3D object model format for the selected BIM 3D modeling program in a second data format in a second data file;

enhancing and extending the selected BIM 3D modeling program with the new final type of 3D object model by allowing the creation of the new final type of 3D object model and other new final types of 3D object models for specific products from specific product providers and for new products from the specific product providers or new product providers that did not originally exist in the selected BIM 3D modeling program and were not originally included in the selected BIM 3D modeling program; and further enhancing and extending the selected BIM 3D modeling program by allowing the library application on the first server network device to send via the communications network the new final type of 3D object model to a second server application on a second server network device with one or more processors to create an actual physical 3D object for a new product that did not previously exist and was not previously available from the specific product providers or the new product providers and is represented by the new final type of 3D object model.

20. A system for creating three-dimensional (3D) objects from two dimensional (2D) data, comprising in combination:

a communications network;

one or more network devices each with one or more processors connected to the communications network, the one or more network devices executing a plurality of instructions in one or more non-transitory computer readable mediums and configured for:

receiving on a first server application on a first server network device with one or more processors, two-dimensional (2D) electronic data for a new specific type of three-dimensional (3D) object model for a selected type of 3D modeling program including a Building Information Modeling (BIM) 3D modeling program from a target application on target network device with one or more processors via a communications network, wherein the new specific type of three-dimensional (3D) object model did not previously exist as a native 3D object model in the BIM 3D modeling program;

selecting from the first server application a blank generic 3D object template for the new specific type of three-dimensional (3D) object model included in the received 2D electronic data;

creating on the first server application a preliminary specific 3D object model in the selected blank generic 3D object model template in a selected mark-up language with the received 2D electronic data;

converting on the first server application the created preliminary specific 3D object model in the selected mark-up language to a first data format in a first data file;

sending from the first server application to a library application on the first server network device the first data file and a final type of 3D object model format for the selected BIM 3D modeling program;

converting from the library application the created preliminary specific 3D object model and the final type of 3D object model format into a new final type of 3D object model for the selected BIM 3D modeling program, wherein the new final type of 3D object model requires less storage space than native 3D object models used within the selected BIM 3D modeling program;

sending from the library application on the first server network device to the target application on the target network device via the communications network the new final type of 3D object model including the final type of 3D object model format for the selected BIM 3D modeling program in a second data format in a second data file;

enhancing and extending the selected BIM 3D modeling program with the new final type of 3D object model by allowing the creation of the new final type of 3D object model and other new final types of 3D object models for specific products from specific product providers and for new products from the specific product providers or new product providers that did not originally exist in the selected BIM 3D modeling program and were not originally included in the selected BIM 3D modeling program; and further enhancing and extending the selected BIM 3D modeling program by allowing the library application on the first server network device to send via the communications network the new final type of 3D object model to a second server application on a second server network device with one or more processors to create an actual physical 3D object for a new product that did not previously exist and was not previously available from the specific product providers or the new product providers and is represented by the new final type of 3D object model.

* * * * *